(12) United States Patent
Matsuura et al.

(10) Patent No.: US 6,750,608 B2
(45) Date of Patent: Jun. 15, 2004

(54) ORGANIC ELECTROLUMINESCENCE ELEMENT AND DISPLAY

(75) Inventors: Mitsunori Matsuura, Tokyo (JP); Taketoshi Yamada, Saitama (JP); Hiroshi Kita, Tokyo (JP)

(73) Assignee: Konica Corporation, Tokyo (JP)

( * ) Notice: Subject to any disclaimer, the term of this patent is extended or adjusted under 35 U.S.C. 154(b) by 0 days.

(21) Appl. No.: 10/285,118

(22) Filed: Oct. 31, 2002

(65) Prior Publication Data

US 2003/0137239 A1 Jul. 24, 2003

(30) Foreign Application Priority Data

Nov. 9, 2001 (JP) ........................ 2001-344385

(51) Int. Cl.$^7$ ............................ G09G 3/12; C09K 11/06
(52) U.S. Cl. ........................ 313/504; 313/506
(58) Field of Search ................ 313/504, 506; 428/690, 917; 427/66; 315/169.3

(56) References Cited

U.S. PATENT DOCUMENTS 5,294,869 A * 3/1994 Tang et al. ................ 313/504

2002/0134984 A1 * 9/2002 Igarashi ................ 257/79

FOREIGN PATENT DOCUMENTS

JP 2002100479 A * 4/2002 .......... H05B/33/22

* cited by examiner

*Primary Examiner*—Nimeshkumar D. Patel
*Assistant Examiner*—Glenn Zimmerman
(74) *Attorney, Agent, or Firm*—Frishauf, Holtz, Goodman & Chick, P.C.

(57) ABSTRACT

An organic electroluminescence element is disclosed which comprises a cathode, a light emission layer containing a host compound and a dopant compound, and at least one first layer provided between the cathode and the light emission layer, wherein the dopant compound is a phosphorescent compound, and the first layer is comprised of a first material having a molecular weight of from 500 to 2000, a maximum fluorescence wavelength of not longer than 415 nm, and an F to (H+F) ratio F/(H+F) of from 0 to 0.9 in which F and H represent the fluorine atom number and the hydrogen atom number in the molecule of the material, respectively.

13 Claims, 1 Drawing Sheet

ORGANIC ELECTROLUMINESCENCE ELEMENT AND DISPLAY

FIELD OF THE INVENTION

This invention relates to an organic electroluminescence element and a display, and particularly to an organic electroluminescence element excellent in luminance of emitted light and lifetime and a display comprising the organic electroluminescence element.

BACKGROUND OF THE INVENTION

As an emission type electronic displaying device, there is an electroluminescence device (ELD). As elements constituting the ELD, there is an inorganic electroluminescence (hereinafter referred to also as inorganic EL) element or an organic electroluminescence (hereinafter referred to also as organic EL) element. The inorganic electroluminescence element has been used for a plane-shaped light source, but a high voltage alternating current has been required to drive the element. An organic electroluminescence element has a structure in which a light emission layer containing a light emission compound is arranged between a cathode and an anode, and an electron and a hole were injected into the light emission layer and recombined to form an exciton. The element emits light, utilizing light (fluorescent light or phosphorescent light) generated by inactivation of the exciton, and the element can emit light by applying a relatively low voltage of from several volts to several decade volts. The element has a wide viewing angle and a high visuality since the element is of self light emission type. Further, the element is a thin, complete solid element, and therefore, the element is noted from the viewpoint of space saving and portability.

However, an organic EL element for practical use is required which efficiently emits light with high luminance at a lower power.

In U.S. Pat. No. 3,093,796, there is disclosed an element in which stilbene derivatives, distyrylarylene derivatives or tristyrylarylene derivatives are doped with a slight amount of a fluorescent compound.

An element is known which comprises an organic light emission layer containing an 8-hydroxyquinoline aluminum complex as a host compound doped with a slight amount of a fluorescent compound (Japanese Patent O.P.I. Publication No. 63-264692), and an element is known which comprises an organic light emission layer containing an 8-hydroxyquinoline aluminum complex as a host compound doped with a quinacridone type dye (Japanese Patent O.P.I. Publication No. 3-255190).

When light emitted through excited singlet state is used, the upper limit of the external quantum efficiency ($\eta$ext) is considered to be at most 5%, as the generation ratio of singlet excited species to triplet excited species is 1:3, that is, the generation probability of excited species capable of emitting light is 25%, and further, external light emission efficiency is 20%. Since an organic EL element, employing phosphorescence through the excited triplet, was reported by Prinston University (M. A. Baldo et al., Nature, 395, 17, p. 151–154 (1998)), study on materials emitting phosphorescence at room temperature has been actively made. (M. A. Baldo et al., Nature, 403, 17, p. 750–753 (2000), and U.S. Pat. No. 6,097,147 etc.) As the upper limit of the internal quantum efficiency of the excited triplet is 100%, the light emission efficiency of the exited triplet is theoretically four times that of the excited singlet. Accordingly, light emission employing the excited triplet exhibits the same performance as a cold cathode tube, and can be applied to illumination.

Several proposals with respect to the phosphorescent material were made in "The $10^{th}$ International Workshop On Inorganic and Organic Electroluminescence (EL '00, Hamamatsu). For example, Ikai et al. use, a hole transport compound as a host compound of a phosphorescent compound, M. E. Tompson et al. use, as a host compound of a phosphorescent compound, various kinds of electron transporting compounds doped with a new iridium complex, and Tsutsui et al. obtain high luminance due to introduction of a hole blocking layer (an exciton blocking layer). Pioneer Corporation proposes a hole blocking layer employing a certain kind of an aluminum complex. Ikai et al. disclose a hole blocking layer (an exciton blocking layer) employing a fluorine-containing compound in Appl. Phys. Lett., 79, 156 (2001), whereby high light emission efficiency is obtained.

However, the techniques described above do not provide an organic EL element providing both high emission luminance and long emission lifetime.

SUMMARY OF THE INVENTION

An object of the present invention is to provide an organic electroluminescence element improved both in emission luminance lifetime and emission lifetime, and a display employing the organic electroluminescence element, which emits light with high emission luminance at reduced power.

DETAILED DESCRIPTION OF THE INVENTION

Figure 1:
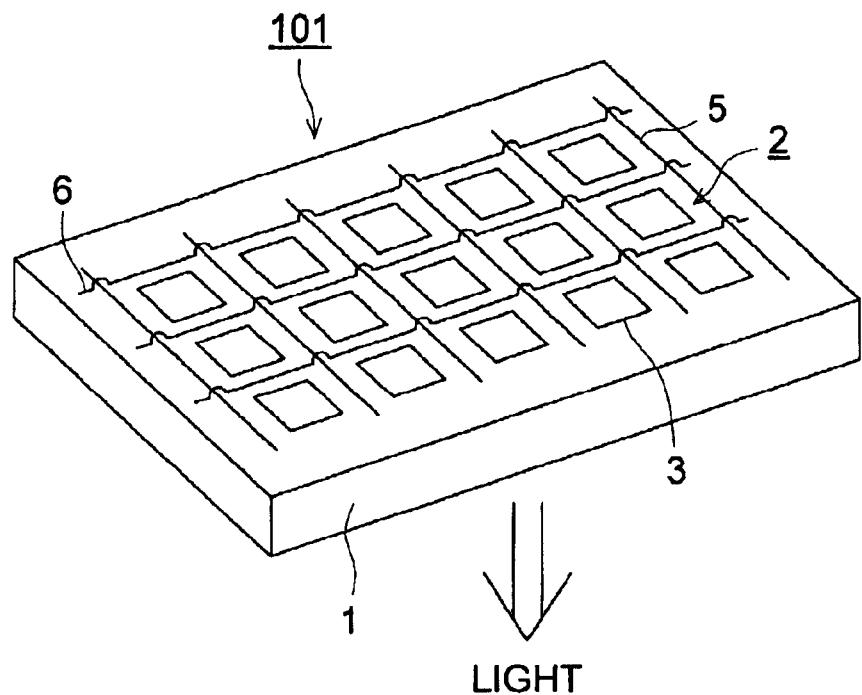
FIG. 1 is a schematic drawing of a displaying section of a multicolor display.

The above object of the invention can be attained by the following constitution:

1. An organic electroluminescence element comprising a cathode, a light emission layer containing a host compound and a dopant compound, and at least one first layer provided between the cathode and the light emission layer, wherein the dopant compound is a phosphorescent compound, and the first layer is comprised of a first material having a molecular weight of from 500 to 2000, a maximum fluorescence wavelength of not longer than 415 nm, and an F to (H+F) ratio F/(H+F) of from 0 to 0.9 in which F and H represent the fluorine atom number and the hydrogen atom number in the molecule of the material, respectively.

2. The organic electroluminescence element of item 1 above, wherein the molecular weight of the first material is from 500 to 2000.

3. The organic electroluminescence element of item 1 above, wherein the F to (H+F) ratio F/(H+F) of the first material is from 0.1 to 0.7.

4. The organic electroluminescence element of item 1 above, wherein the maximum fluorescence wavelength of the first material is not longer than 400 nm.

5. The organic electroluminescence element of item 1 above, wherein one of the first layers is adjacent to the light emission layer.

6. The organic electroluminescence element item 1 above, wherein the host compound has a maximum fluorescence wavelength of not longer than 415 nm.

7. The organic electroluminescence element of item 6 above, wherein the host compound has a maximum fluorescence wavelength of not longer than 400 nm.

8. The organic electroluminescence element of item 1 above, further comprising an anode on the side of the light emission layer opposite the cathode and at least one second layer provided between the anode and the light emission layer, wherein the second layer is comprised of a second material.

9. The organic electroluminescence element of item 8 above, wherein the second material has a maximum fluorescence wavelength of not longer than 415 nm.

10. A display having an organic electroluminescence element comprising a cathode, a light emission layer containing a host compound and a dopant compound, and at least one first layer provided between the cathode and the light emission layer, wherein the dopant compound is a phosphorescent compound, and the first layer is comprised of a first material having a molecular weight of from 500 to 2000, a maximum fluorescence wavelength of not longer than 415 nm, and an F to (H+F) ratio F/(H+F) of from 0 to 0.9 in which F and H represent the fluorine atom number and the hydrogen atom number in the molecule of the material, respectively.

11. A multicolor display comprising two or more kinds of organic electroluminescence elements, which emit lights with different maximum emission wavelengths according to electroluminescence, wherein at least one organic electroluminescence element of the elements is an organic electroluminescence element comprising a cathode, a light emission layer containing a host compound and a dopant compound, and at least one first layer provided between the cathode and the light emission layer, wherein the dopant compound is a phosphorescent compound, and the first layer is comprised of a first material having a molecular weight of from 500 to 2000, a maximum fluorescence wavelength of not longer than 415 nm, and an F to (H+F) ratio F/(H+F) of from 0 to 0.9 in which F and H represent the fluorine atom number and the hydrogen atom number in the molecule of the material, respectively.

Claim 12. The organic electroluminescence element of item 1 above, wherein the first layer is an electron transporting layer, and the first material is an electron transporting material having a molecular weight of from 500 to 2000, a maximum fluorescence wavelength of not longer than 415 nm, and an F to (H+F) ratio F/(H+F) of from 0 to 0.9 in which F and H represent the fluorine atom number and the hydrogen atom number in the molecule of the material, respectively.

Claim 13. The organic electroluminescence element of item 8 above, wherein the second layer is a hole transporting layer, and the second material is a hole transporting material with a maximum fluorescence wavelength of not longer than 415 nm.

21. An organic electroluminescence element comprising a cathode, a light emission layer containing a host compound and a dopant compound, and at least one first layer provided between the cathode and the light emission layer, wherein the dopant compound is a phosphorescent compound, and a first material constituting the at least one first layer has a maximum fluorescence wavelength of not longer than 415 nm, a molecular weight of from 500 to 2000 and an F to (H+F) ratio F/(H+F) of from 0 to 0.9 in which F and H represent the fluorine atom number and the hydrogen atom number in the molecule of the material, respectively.

22. The organic electroluminescence element of item 21 above, wherein the molecular weight of the first material constituting the at least one first layer provided between the cathode and the light emission layer is from 700 to 2000.

23. The organic electroluminescence element of item 21 or 22 above, wherein the ratio F/(H+F) of the first material constituting the at least one first layer provided between the cathode and the light emission layer is from 0.1 to 0.7.

24. The organic electroluminescence element of any one of items 21 through 23 above, wherein the maximum fluorescence wavelength of the first material constituting the at least one first layer provided between the cathode and the light emission layer is not longer than 400 nm.

25. The organic electroluminescence element of any one of items 21 through 24 above, wherein one of the first layers provided between the light emission layer and the cathode is adjacent to the light emission layer.

26. The organic electroluminescence element of any one of items 21 through 25 above, wherein the host compound has a maximum fluorescence wavelength of not longer than 415 nm.

27. The organic electroluminescence element of item 26, wherein the host compound has a maximum fluorescence wavelength of not longer than 400 nm.

28. The organic electroluminescence element of any one of items 21 through 27 above, further comprising an anode on the side of the light emission layer opposite the cathode, wherein a second material, constituting at least one second layer provided between the anode and the light emission layer, has a maximum fluorescence wavelength of not longer than 415 nm.

29. A display comprising the organic electroluminescence element of any one of items 21 through 28 above.

30. A multicolor display comprising two or more kinds of organic electroluminescence elements, which emit lights with different maximum emission wavelengths according to electroluminescence, wherein at least one organic electroluminescence element of the elements is the organic electroluminescence element of any one of items 21 through 28 above.

The present invention will be explained in detail below.

The present inventors have made an extensive study on a material constituting at least one layer, which is provided between a cathode and a light emission layer containing a phosphorescent dopant, in an organic electroluminescence element, and as a result, they have found that a material having a specific molecular weight, a specific maximum fluorescence wavelength, and a specific value of an F to (F+H) ratio F/(H+F), in which R and H represent the fluorine atom number and the hydrogen atom number in the molecule of the material, respectively, provides high emission luminance and long emission lifetime. Concretely, they have found that an organic electroluminescence element provides improved emission luminance and emission lifetime, which comprises a cathode, a light emission, and at least one first layer provided between the cathode and the light emission layer, wherein the first layer is comprised of a first material (hereinafter referred to also as the material in the invention) having a molecular weight of from 500 to 2000, a maximum fluorescence wavelength of not longer than 415 nm, and an F to (H+F) ratio F/(H+F) of from 0 to 0.9 in which F and H represent the fluorine atom number and the hydrogen atom number in the molecule of the material, respectively.

In order to exhibit the effects of the invention markedly, it is preferred that the maximum fluorescence wavelength, the molecular weight, and the ratio F/(H+F) of the material in the invention is not longer than 400 nm, from 700 to 2000, and from 0.1 to 0.7, respectively. Further, the host compound contained in the light emission layer has a maximum fluorescence wavelength of preferably not longer than 415 nm, and more preferably not longer than 400 nm. In the organic electroluminescence element, an anode is provided on the side of the light emission layer opposite the cathode, at least one second layer is provided between the anode and the light emission layer and is comprised of a second material having a maximum emission wavelength of preferably not longer than 415 nm.

The maximum fluorescence wavelength referred to in the invention is a wavelength giving the maximum fluorescent intensity in the fluorescent spectra of a 100 nm thick layer of a compound or a material deposited on a glass plate.

In the invention, the first layer provided between the light emission layer and the cathode is considered to function as a layer (an electron transporting layer) transporting electrons injected from the cathode to the light emission layer, as a layer (a hole blocking layer) preventing holes injected from the anode from flowing out into the cathode and increasing efficiency of the recombination of the electrons and holes, or as a layer (an exciton blocking layer) enclosing excitons generated by that recombination within the light emission layer.

The organic EL element comprises plural layers of an organic compound, but may comprise a layer (such as a layer of lithium fluoride or an inorganic metal salt, or a layer containing them) other than the layers of the organic compound.

The layers of the organic compound comprises at least two layers including a light emission layer having the regions (light emission regions) where light is emitted due to a recombination of holes and electrons injected from a pair of electrodes, and an adjacent layer adjacent to the light emission layer. The light emission regions may occupy the whole of the light emission layer, or a part in the thickness direction of the light emission layer. Further, the light emission regions may be an interface between the light emission layer and the adjacent layer. In the invention, when two layers show the light emission regions, one is a light emission layer and the other is an adjacent layer adjacent to the light emission layer.

The adjacent layer, which will be described later, can be broadly classified into two, that is, a hole transporting layer and an electron transporting layer due to its function. Further, the adjacent layer can be narrowly classified into a hole injecting layer, a hole transporting layer, an electron blocking layer, an electron injecting layer, an electron transporting layer, and a hole blocking layer due to its function.

With respect to the host compound and dopant compound contained in the light emission layer, when the light emission layer is comprised of a mixture of two or more kinds of compounds, the compound having the highest content in the mixture is the host compound and the compound having a lower content in the mixture is the dopant compound. For example, when the compound A to compound B ratio (by weight) in the light emission layer is 10:90, compound A is a dopant compound, and the compound B is a host compound.

Further, when the content ratio, compound A:compound B:compound C in the light emission layer is 5:10:85, compounds A and B are dopant compounds, and compound C is a host compound.

The content ratio of the dopant compound is preferably 0.001 to less than 50% by weight, and the content ratio of the host compound is preferably 50 to less than 100% by weight.

The maximum fluorescence wavelength is a wavelength giving the maximum fluorescent intensity in the fluorescent spectrum, and is a value specifying a physical property of the materials. When there are plural maximum fluorescence wavelengths, the maximum fluorescence wavelength with the longest wavelength is the maximum fluorescence wavelength. That is, when there are plural energy states providing fluorescence, the maximum fluorescence wavelength represents a wavelength providing the lowest excitation state excited with the lowest energy, and does not relate to fluorescence intensity. When fluorescence intensity is extremely low, the maximum fluorescence wavelength may be not longer than 415 nm.

Two or more organic EL elements having different maximum emission wavelengths are those in which when electric field is applied to the elements, the difference between the different maximum emission wavelengths emitted is not less than 10 nm. Herein, the maximum emission wavelengths emitted are preferably in the range of from 400 to 700 nm. When three different organic EL elements are arranged in the same base plate, the maximum emission wavelength emitted from the first one is preferably in the range of from 430 to 480 nm (in the blue light wavelength region), the maximum emission wavelength emitted from the second one is preferably in the range of from 500 to 570 nm (in the green light wavelength region), and the maximum emission wavelength emitted from the third one is preferably in the range of from 570 to 680 nm (in the red light wavelength region).

In the invention, preferred examples of a layer constitution of an organic EL element will be shown below, but the present invention is not limited thereto.

(i) Anode/Light emission layer/Electron transporting layer/Cathode
(ii) Anode/Hole transporting layer/Light emission layer/Electron transporting layer/Cathode
(iii) Anode/Hole injecting layer/Light emission layer/Hole blocking layer/Electron transporting layer/Cathode
(iv) Anode/Hole transporting layer/Light emission layer/Hole blocking layer/Electron transporting layer/Cathode buffer layer/Cathode
(v) Anode/Anode buffer layer/Hole transporting layer/Light emission layer/Hole blocking layer/Electron transporting layer/Cathode buffer layer/Cathode For the anode of the organic EL element, a metal, an alloy, or an electroconductive compound each having a high working function (not less than 4 eV), and mixture thereof are preferably used as the electrode material. Concrete examples of such an electrode material include a metal such as Au, and a transparent electroconductive material such as CuI, indium tin oxide (ITO), $SnO_2$, or ZnO, and a material capable of forming an amorphous and transparent conductive layer such as IDIXO ($In_2O_3$—ZnO). The anode may be prepared by forming a thin layer of the electrode material according to a depositing or sputtering method, and by forming the layer into a desired pattern according to a photolithographic method. When required precision of the pattern is not so high (not less than 100 $\mu$m), the pattern may be formed by depositing or sputtering of the electrode material through a mask having a desired form. When light is emitted through the anode, the transmittance of the anode is preferably 10% or more, and the sheet resistance of the anode is preferably not more than several hundred $\Omega/\square$. The thickness of the anode is ordinarily within the range of from 10 nm to 1 $\mu$m, and preferably from 10 to 200 nm, although it may vary due to kinds of materials used.

On the other hand, for the cathode, a metal (also referred to as an electron injecting metal), an alloy, and an electroconductive compound each having a low working function (not more than 4 eV), and a mixture thereof is used as the electrode material. Concrete examples of such an electrode material include sodium, sodium-potassium alloy, magnesium, lithium, a magnesium/copper mixture, a magnesium/silver mixture, a magnesium/aluminum mixture, magnesium/indium mixture, an aluminum/aluminum oxide ($Al_2O_3$) mixture, indium, a lithium/aluminum mixture, and a rare-earth metal. Among them, a mixture of an electron injecting metal and a metal higher in the working function than that of the electron injecting metal, such as the magnesium/silver mixture, magnesium/aluminum mixture, magnesium/indium mixture, aluminum/aluminum oxide ($Al_2O_3$) mixture, lithium/aluminum mixture, or aluminum is suitable from the view point of the electron injecting ability and resistance to oxidation. The cathode can be prepared forming a thin layer of such an electrode material by a method such as a deposition or sputtering method. The sheet resistance as the cathode is preferably not more than several hundred $\Omega/\square$, and the thickness of the cathode is ordinarily from 10 nm to 1 $\mu$m, and preferably from 50 to 200 nm. It is preferable in increasing emission luminance that either the anode or the cathode of the organic EL element is transparent or semi-transparent.

Next, an injecting layer, a hole transporting layer or an electron transporting layer in the invention will be explained.

The injecting layer is optionally provided, and as the injecting layer there are an electron injecting layer and a hole injecting layer. The hole injecting layer may be provided between the anode and the light emission layer or hole transporting layer, and the electron injecting layer between the cathode and the light emission layer or electron transporting layer as described above.

The injecting layer herein referred to is a layer provided between the electrode and an organic layer in order to reduce driving voltage or to increase emission luminance. As the buffer layer there are a hole injecting layer (an anode buffer layer) and an electron injecting layer (a cathode buffer layer), which are described in "Electrode Material" page 123, Div. 2 Chapter 2 of "Organic EL element and its frontier of industrialization" (published by NTS Corporation, Nov. 30, 1998) in detail.

The anode buffer layer (hole injecting layer) is described in Japanese Patent O.P.I. Publication Nos. 9-45479, 9-260062, and 8-288069 etc., and its examples include a phthalocyanine buffer layer represented by a copper phthalocyanine layer, an oxide buffer layer represented by a vanadium oxide layer, an amorphous carbon buffer layer, a polymer buffer layer employing an electroconductive polymer such as polyaniline (emeraldine), and polythiophene, etc.

The cathode buffer layer (electron injecting layer) is described in Japanese Patent O.P.I. Publication Nos. 6-325871, 9-17574, and 9-74586, etc. in detail, and its examples include a metal buffer layer represented by a strontium or aluminum layer, an alkali metal compound buffer layer represented by a lithium fluoride layer, an alkali earth metal compound buffer layer represented by a magnesium fluoride layer, and an oxide buffer layer represented by an aluminum oxide.

The buffer layer (injecting layer) is preferably very thin and has a thickness of preferably from 0.1 to 100 nm depending on kinds of the material used.

The blocking layer is a layer provided if necessary in addition to the fundamental configuration layers as described above, and is for example a hole blocking layer as described in Japanese Patent O.P.I. Publication Nos. 11-204258, and 11-204359, and on page 237 of "Organic EL element and its frontier of industrialization" (published by NTS Corporation, Nov. 30, 1998).

The hole blocking layer is an electron transporting layer in a broad sense, and is comprised of material having an ability of transporting electrons but an extremely poor ability of holes, which can increase a recombination probability of electrons and holes by transporting electrons and blocking holes.

On the other hand, the electron blocking layer is an hole transporting layer in a broad sense, and is comprised of material having an ability of transporting holes but an extremely poor ability of electrons, which can increase a recombination probability of electrons and holes by transporting holes and blocking electrons.

The hole transporting layer is comprised of material having an ability of transporting holes, and a hole injecting layer and an electron blocking layer are included in the hole transporting layer in a broad sense.

The hole transporting layer or electron transporting layer may be a single layer or plural layers.

In the organic EL element in the invention, all of the host compound contained in the light emission layer, and a material contained in the hole transporting layer or the electron transporting layer, each layer being adjacent to the light emission layer, have a maximum fluorescence wavelength of preferably not longer than 415 nm.

Next, a dopant compound will be explained.

The dopant compound is divided in two types in principle, one is an energy transfer type in which recombination of a carrier occurs on the host compound to which the carrier is transported to excite the host compound, the resulting energy is transferred to the dopant compound, and light is emitted from the dopant compound, and the other is a carrier trap type in which recombination of a carrier occurs on the dopant compound, a carrier trap material, and light is emitted from the dopant compound. However, in each type of the dopant compound, energy level of the dopant compound in excited state is lower than that of the host compound in excited state.

In the energy transfer type, as condition easily transferring energy, the overlapping integral between emission of the host compound and absorption of the dopant compound is greater. In the carrier trap type, it is necessary to have an energy relationship in which a carrier is easily trapped. For example, when an electron carrier is trapped, it is necessary that electron affinity (LUMO level) of the dopant compound be higher than that (LUMO level) of the host compound. On the contrary, when a hole carrier is trapped, it is necessary that ionization potential (HOMO level) of the dopant compound be lower than that (HOMO level) of the dopant compound.

In view of the above, the dopant compound can be selected based on emission luminance and emission color including color purity, and the host compound can be selected from compounds which have a good carrier transporting property and satisfy the relationship as described above.

The dopant compound in the light emission layer is an organic compound or a complex each emitting phosphorescence. The dopant compound used in the invention is a phosphorescent compound having a phosphorescent quantum yield of preferably not less than 0.001 at 25° C. The phosphorescent compound is preferably a metal complex containing a metal belonging to a group VIII of the periodic table as a center metal, and is more preferably an osmium complex, an iridium complex or a platinum complex.

Examples of the phosphorescent compound are listed below, but the present invention is not limited thereto. These compounds can be synthesized according to a method disclosed in for example, Inorg. Chem., Vol. 40, 1704–1711.
Ir-1
Ir-2
Ir-3
Ir-4
Ir-5
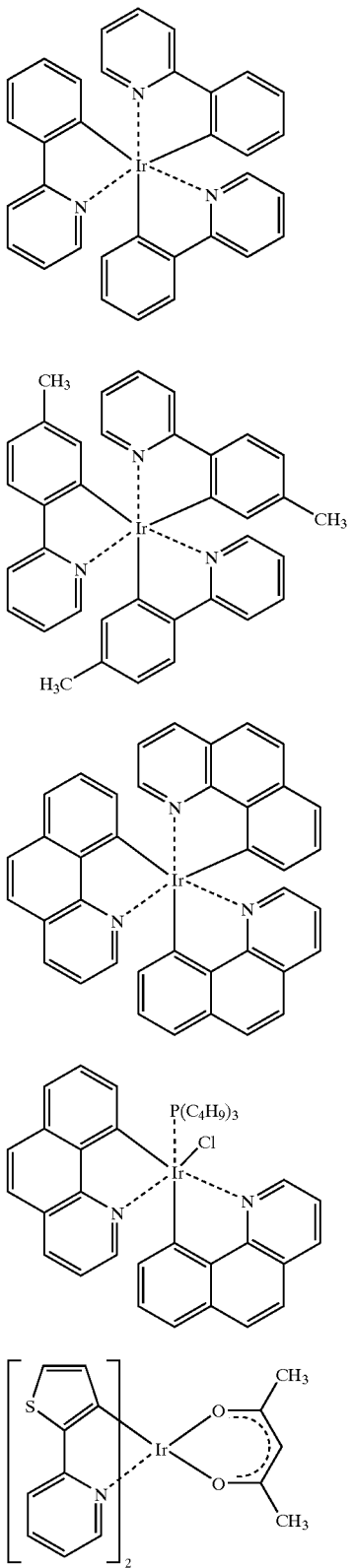
-continued
Ir-6
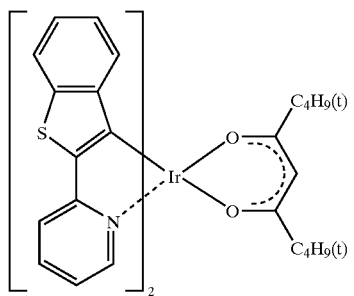
Ir-7
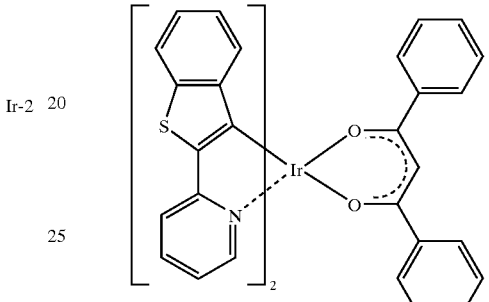
Ir-8
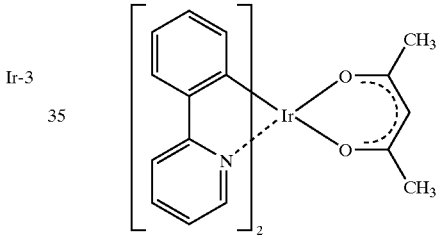
Ir-9
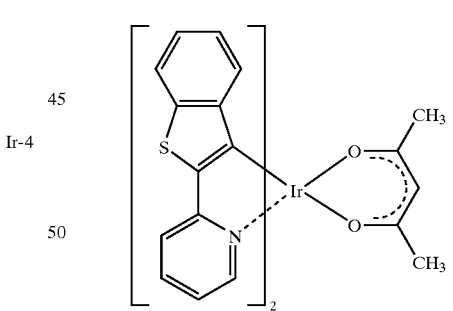
Ir-10
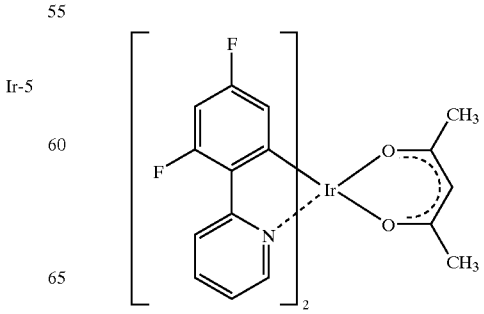

Ir-11

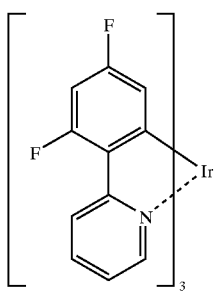

Pt-1

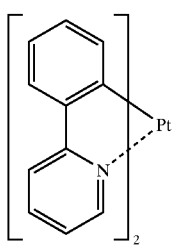

Pt-2

Pt-3

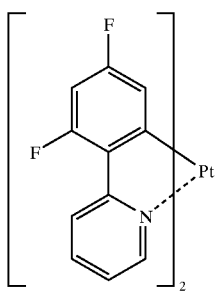

A-1

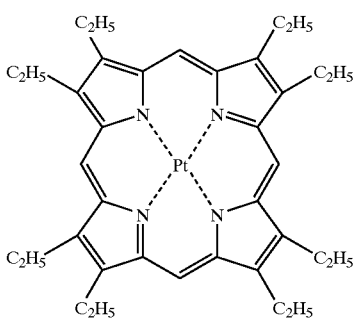

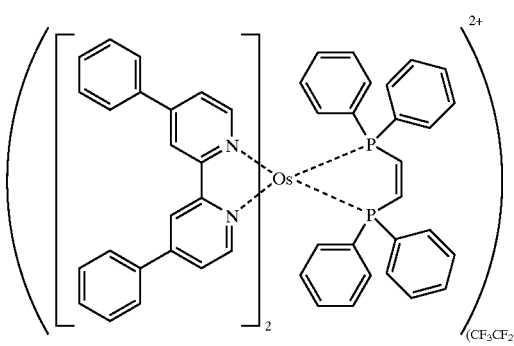

The host compound in the light emission layer is preferably an organic compound or a complex, and the host compound in the invention has a maximum fluorescence wavelength of preferably not longer than 415 nm, and more preferably not longer than 400 nm. Adjusting the maximum fluorescence wavelength of the host compound to 415 nm or shorter enables a visible light emission, particularly a BGR emission.

The ordinary π conjugated fluorescent or phosphorescent compound, in which the maximum fluorescence wavelength is adjusted to not longer than 415 nm, has a π—π absorption in the wavelength regions of not longer than 420 nm, and can carry out a dopant emission of energy transfer type. The fluorescence of not longer than 415 nm provides a wide energy gap (ionization potential-electron affinity, HOMO-LUMO), and advantageously works in the carrier trap type.

Such a host compound can be used optionally selecting from known materials used in the organic EL element, and most of the hole transporting materials or electron transporting materials as described later can be used also as the host compound of the light emission layer.

A polymer such as polyvinyl carbazol or polyfluorenone can be used, and a polymer in which the host compound mentioned above is introduced in the polymer chain or a polymer having the host compound as the polymer main chain can be also used.

The host compound is preferably a compound with high Tg (glass transition temperature), which has a hole transporting ability and an electron transporting ability, and prevents the emission wavelength from shifting to longer wavelength.

Such an organic compound can be prepared for example by arranging the π electron planes of the chemical structure in different planes according to effect of steric hindrance. For example, there is mentioned of a method introducing a substituent causing steric hindrance at the ortho position (to a nitrogen atom) of the aryl groups in triarylamine, whereby a twisted angle formed between the aryl group planes is increased. That is, the host compound with high Tg emitting light with a short wavelength, which has a hole transporting ability and an electron transporting ability, can be prepared without lowering the Tg by introducing a substituent causing steric hindrance such as a methyl group, a t-butyl group, an isopropyl group, or a naphthyl group (a hydrogen atom at a peri-position) in the compound, although the hole transporting ability and electron transporting ability are lowered a little. The substituents are not limited to the above.

The host compound can be also prepared by introducing a conjugated group at the non-conjugated position of an aromatic ring (for example, at the meta position of the phenyl group in triphenylamine).

Examples of the former host compound having a steric hindrance causing substituent or the latter host compound having the conjugated group at the non-conjugated position will be listed below, but are not limited thereto.

13 14
2-1
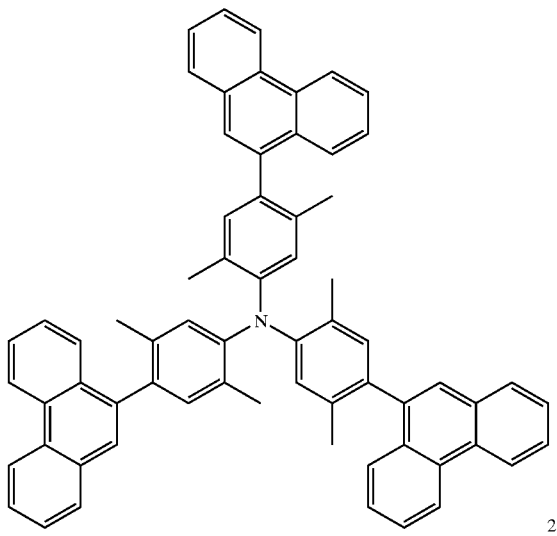
2-2
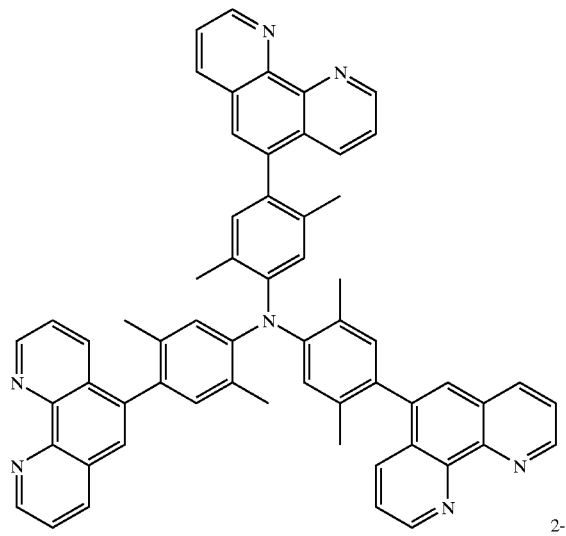
2-3
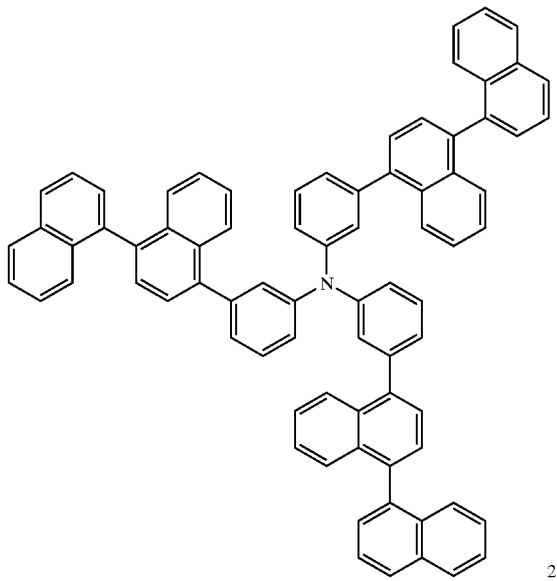
2-4
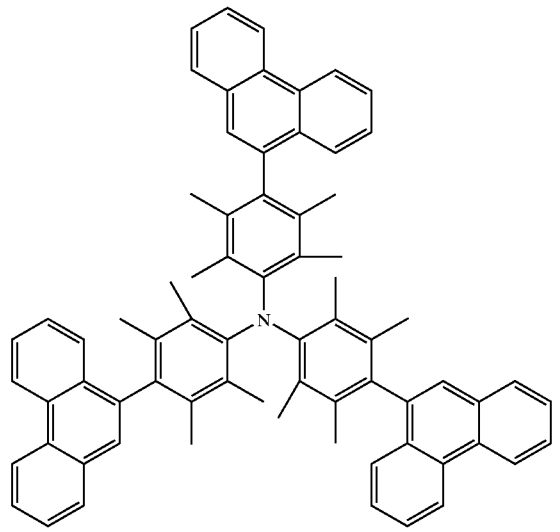
2-5
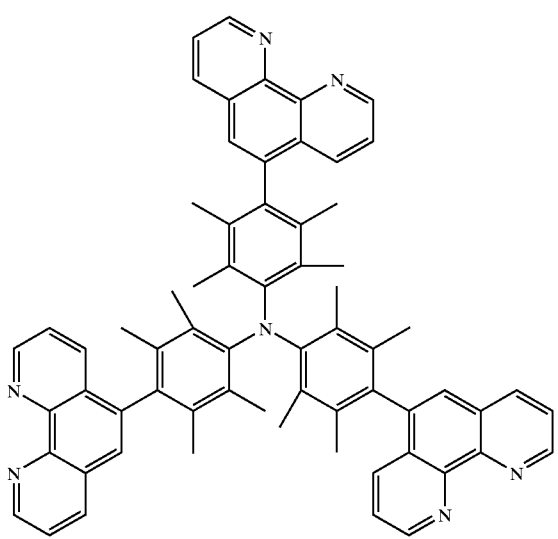
2-6
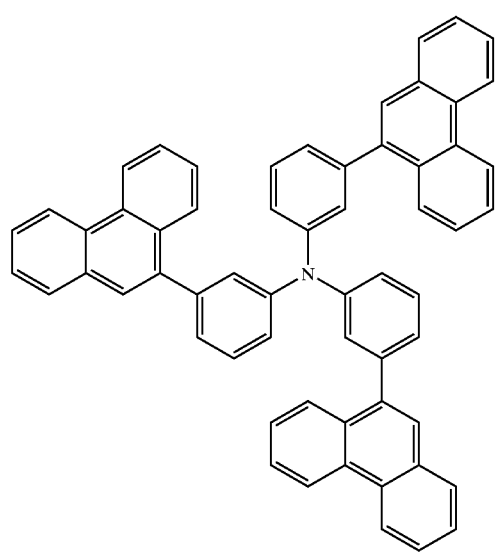

-continued
2-7
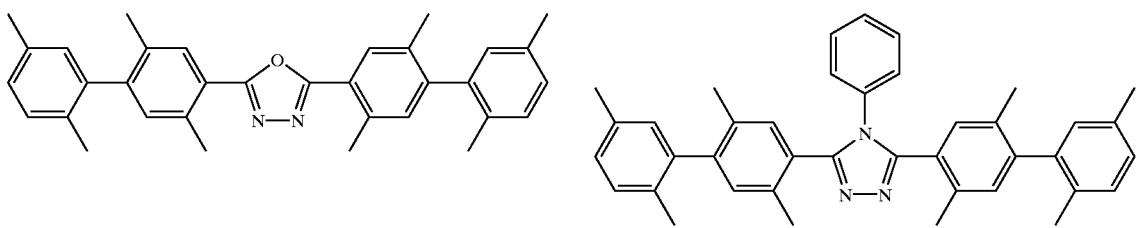
2-8
2-9
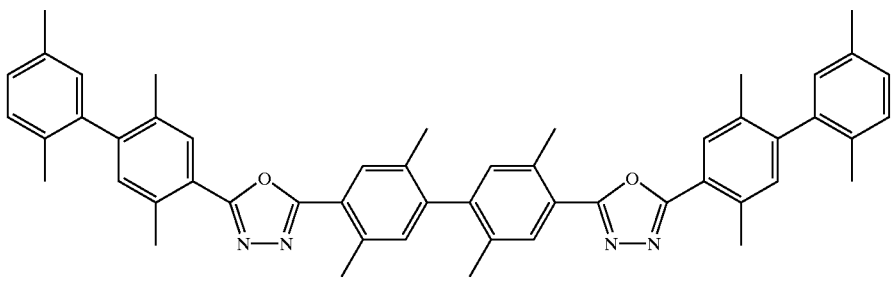
2-10
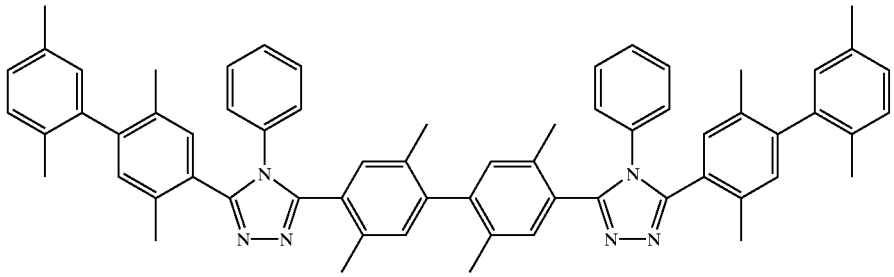
2-11
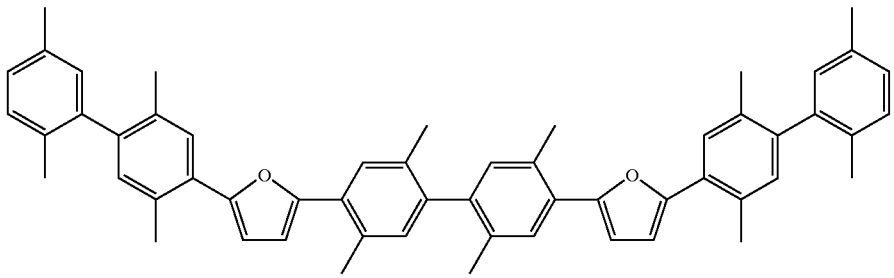
2-12
2-13
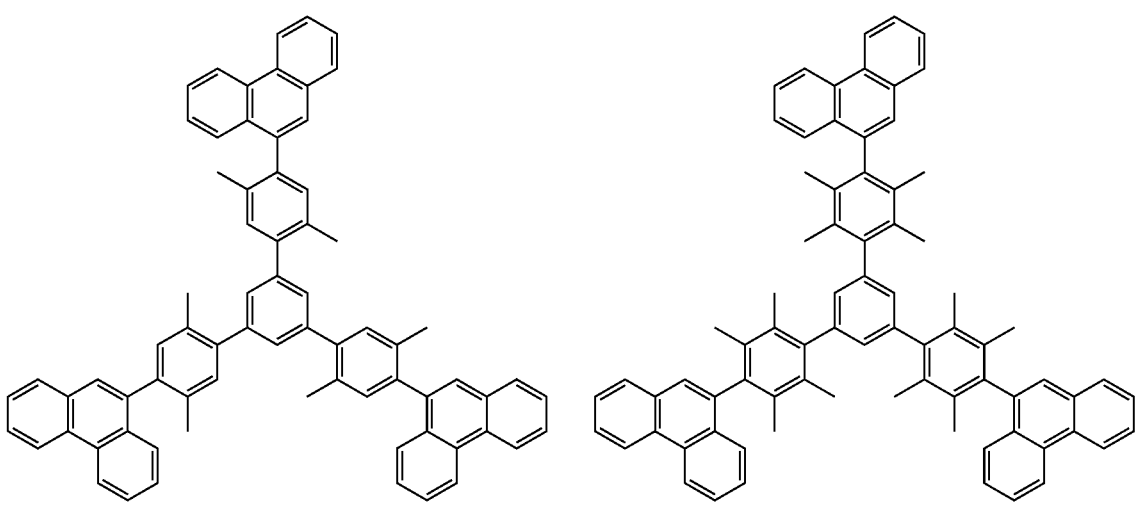

The hole transporting layer comprises a material (a hole transporting material) having a hole transporting ability, and in a broad sense refers to a hole injecting layer or an electron blocking layer. The hole transporting layer can be provided as a single layer or plural layers.

The hole transporting material is not specifically limited, and can be optionally selected from those employed for hole transporting materials in conventional photoconductive elements or known materials used in the hole injecting layer or hole transporting layer of conventional EL elements.

The hole transporting material may be either an organic substance or an inorganic substance as long as it has a hole injecting ability, a hole transporting ability or an ability to form a barrier to electrons. Examples of the hole injecting material or the hole transporting material include a triazole derivative, an oxadiazole derivative, an imidazole derivative, a polyarylalkane derivative, a pyrazoline derivative and a pyrazolone derivative, a phenylenediamine derivative, an arylamine derivative, an amino substituted chalcone derivative, an oxazole derivative, a styryl anthracene derivative, a fluorenone derivative, a hydrazone derivative, a stilbene derivative, a silazane derivative, an aniline copolymer, and an electroconductive oligomer, particularly a thiophene oligomer. As the hole transporting material, those described above are used, but a porphyrin compound, an aromatic tertiary amine compound, or a styrylamine compound is preferably used, and an aromatic tertiary amine compound is more preferably used.

Typical examples of the aromatic tertiary amine compound and styrylamine compound include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quardriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostilbene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in Japanese Patent O.P.I. Publication No. 4-308688 such as 4,4',4"-tris[N-(3-methylphenyl)-N-phenylamino]-triphenylamine (MTDATA) in which three triphenylamine units are bonded in a starburst form.

A polymer in which the material mentioned above is introduced in the polymer chain or a polymer having the material as the polymer main chain can be also used.

As the hole injecting material or the hole transporting material, inorganic compounds such as p-Si and p-SiC are usable.

In the invention, the hole transporting material contained in the hole transporting layer is preferably a compound having a maximum fluorescence wavelength of not longer than 415 nm. That is, the hole transporting material is preferably a material with high Tg, which has a hole transporting ability, and prevents the emission wavelength from shifting to longer wavelength.

Such a material can be prepared for example by arranging the π electron planes of the chemical structure in different planes according to effect of steric hindrance. For example, there is mentioned of a method introducing a substituent causing steric hindrance at the ortho position (to a nitrogen atom) of the aryl groups in triarylamine, whereby a twisted angle formed between the aryl group planes is increased. That is, a hole transporting material with high Tg emitting light with a short wavelength can be prepared without lowering the Tg by introducing a substituent causing steric hindrance such as a methyl group, a t-butyl group, an isopropyl group, or a naphthyl group (a hydrogen atom at a peri-position) in the material, although the hole transporting ability is lowered a little. The substituents are not limited to the above.

The material can be also prepared by introducing a conjugated group at the non-conjugated position of an aromatic ring (for example, at the meta position of the phenyl group in triphenylamine).

Examples of the hole transporting material having a steric hindrance causing substituent or the hole transporting material having a substituent at the non-conjugated position will be listed below, but are not limited thereto.

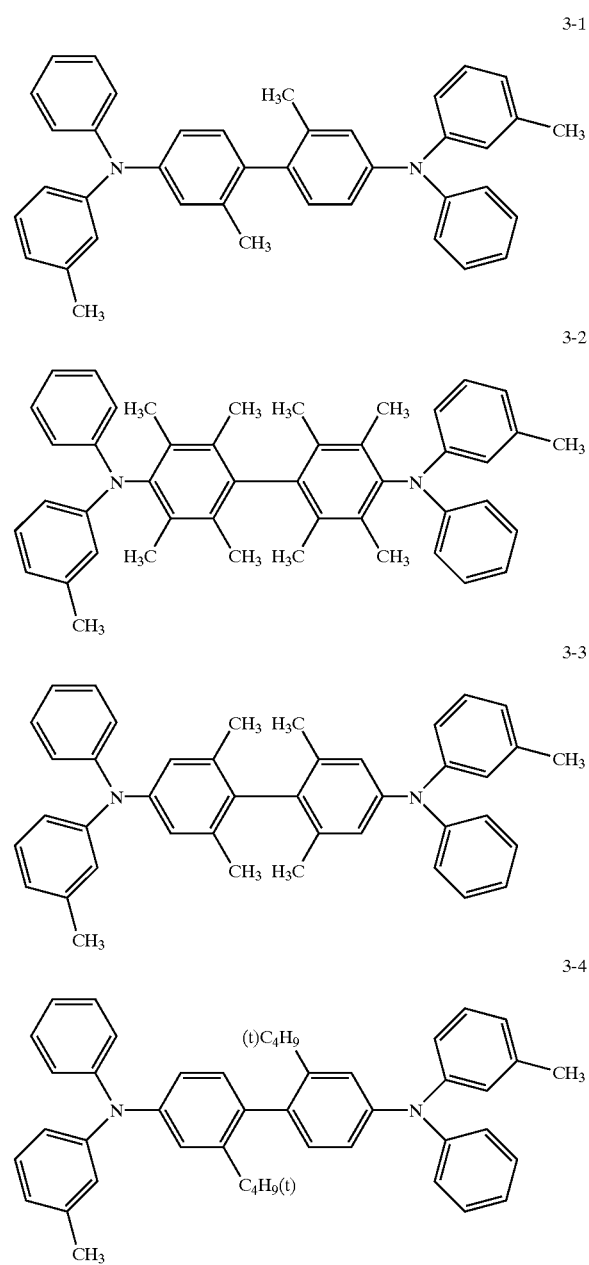

-continued
3-5
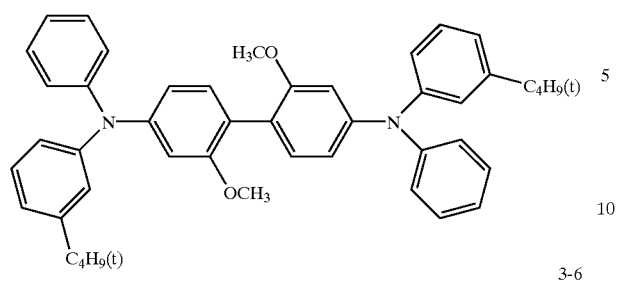
3-6
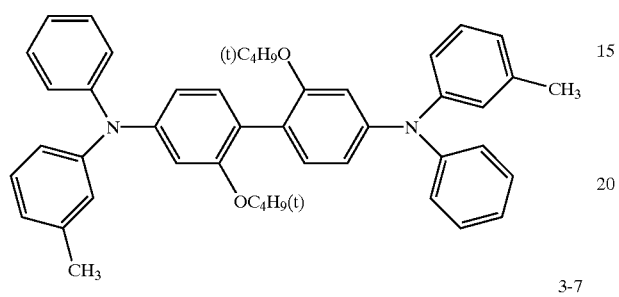
3-7
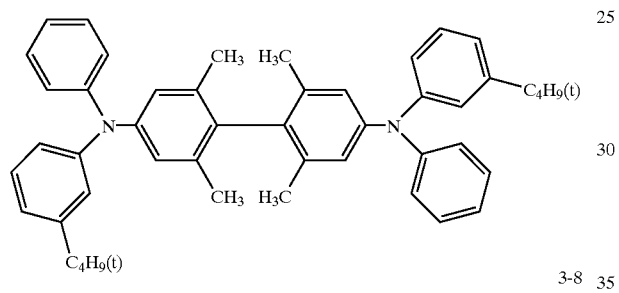
3-8
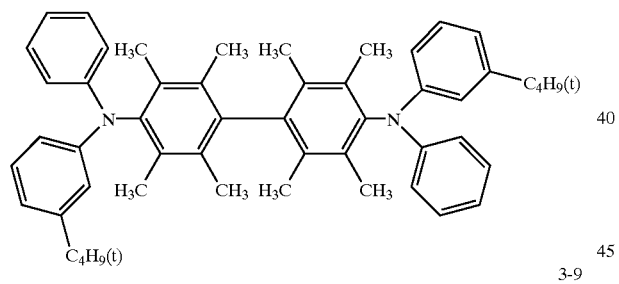
3-9
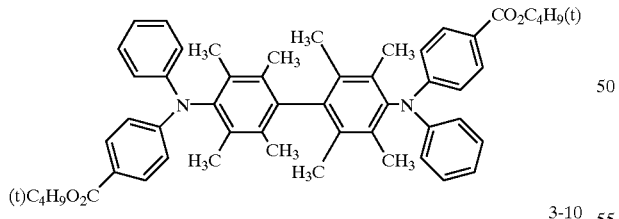
3-10
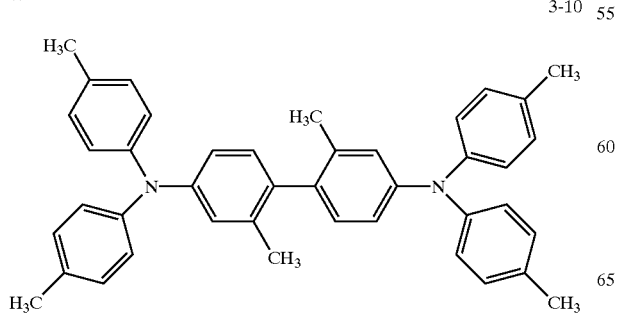
-continued
3-11
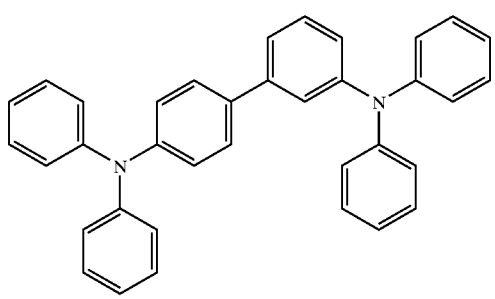
3-12
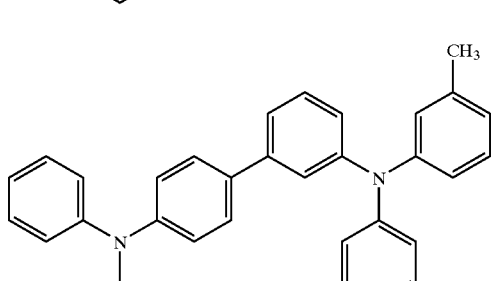
3-13
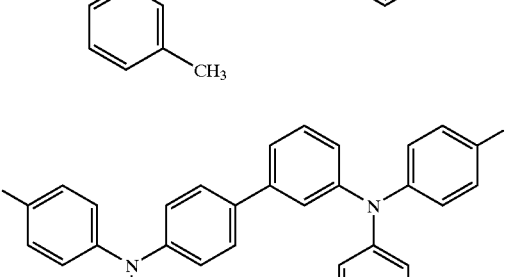
3-14
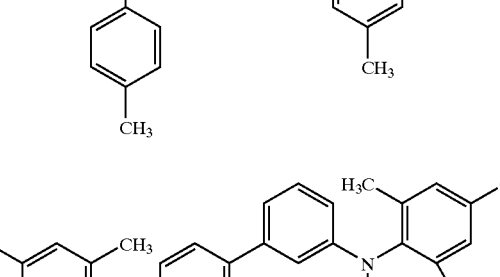
3-15
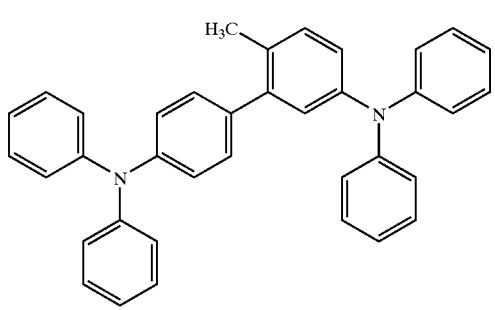

-continued
3-16
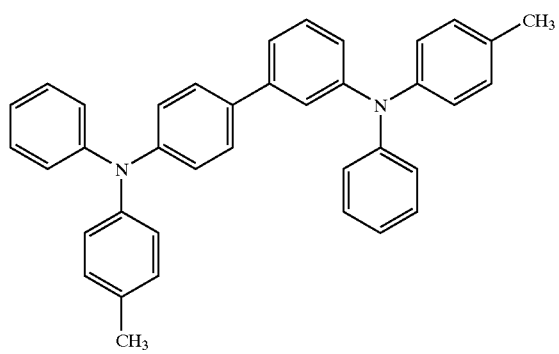
3-17
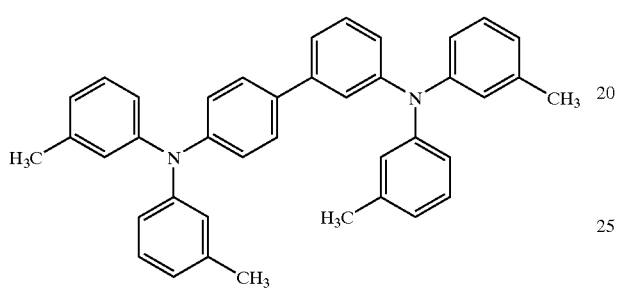
3-18
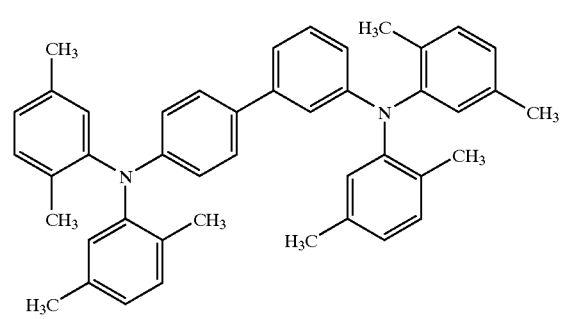
3-19
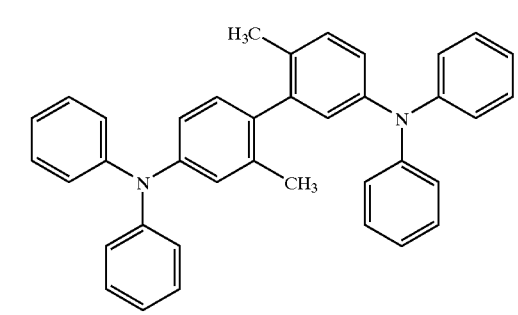
3-20
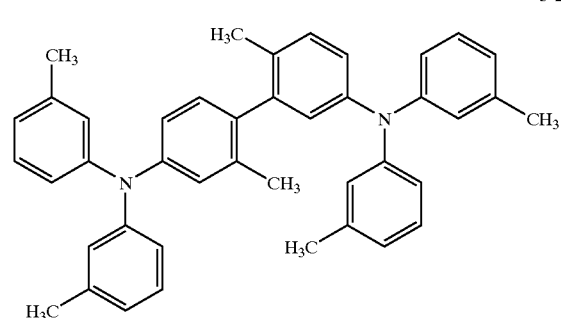
-continued
3-21
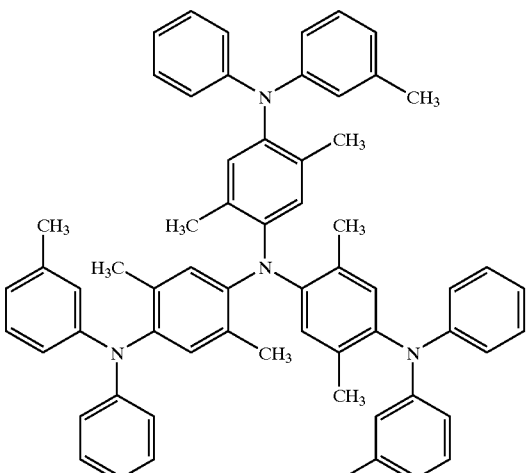
3-22
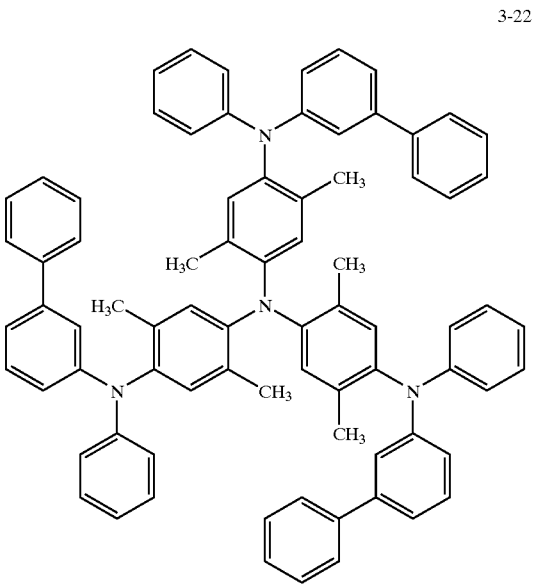
3-23
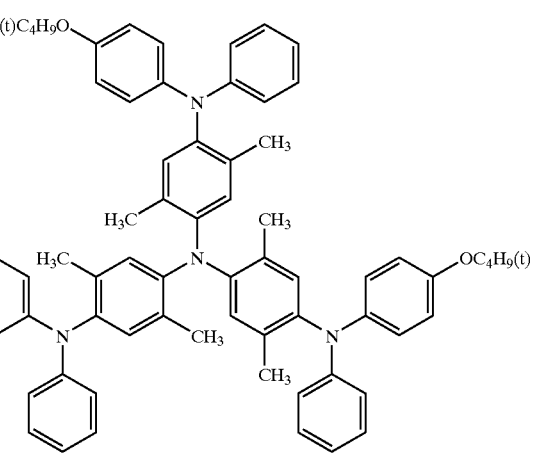

3-24
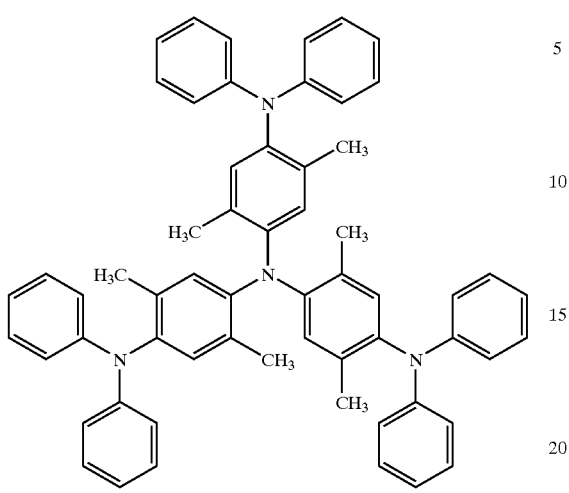
3-27
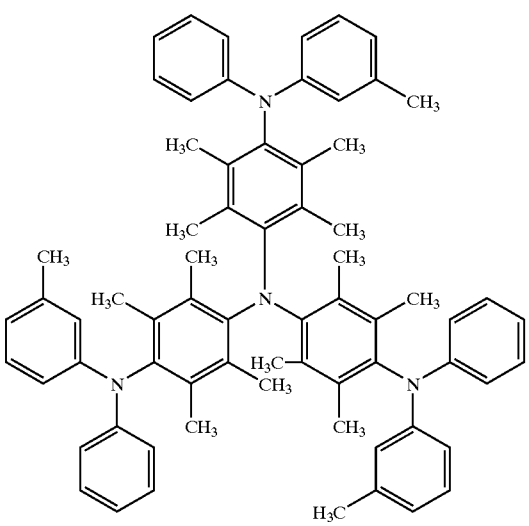
3-25
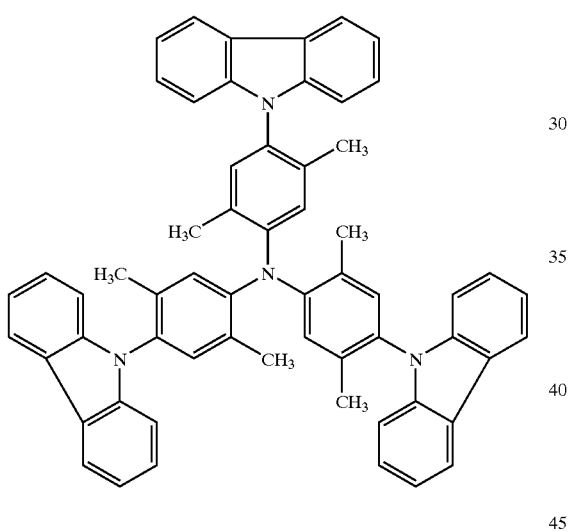
3-28
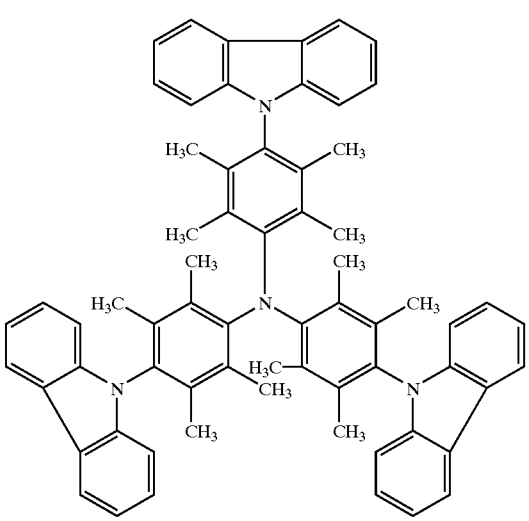
3-26
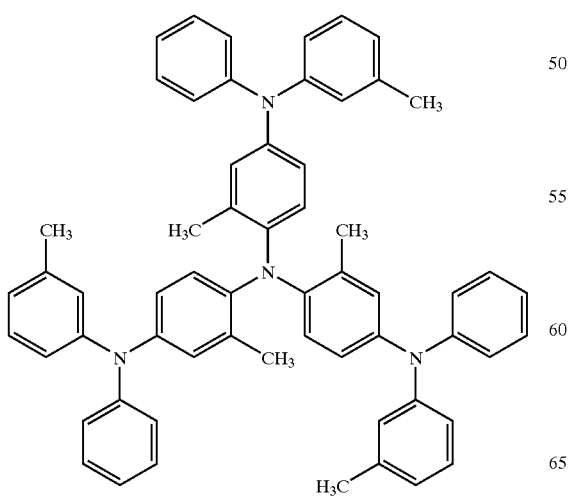
3-29
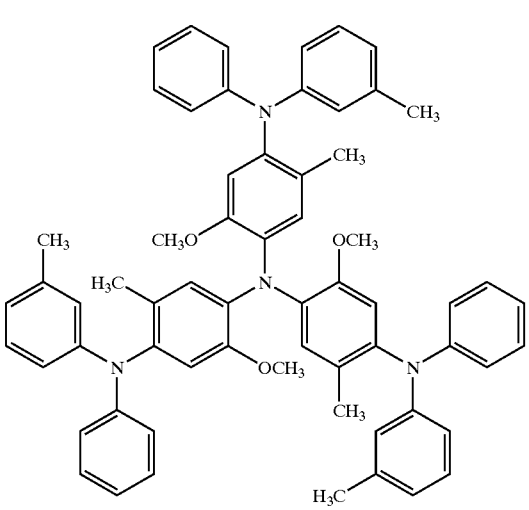

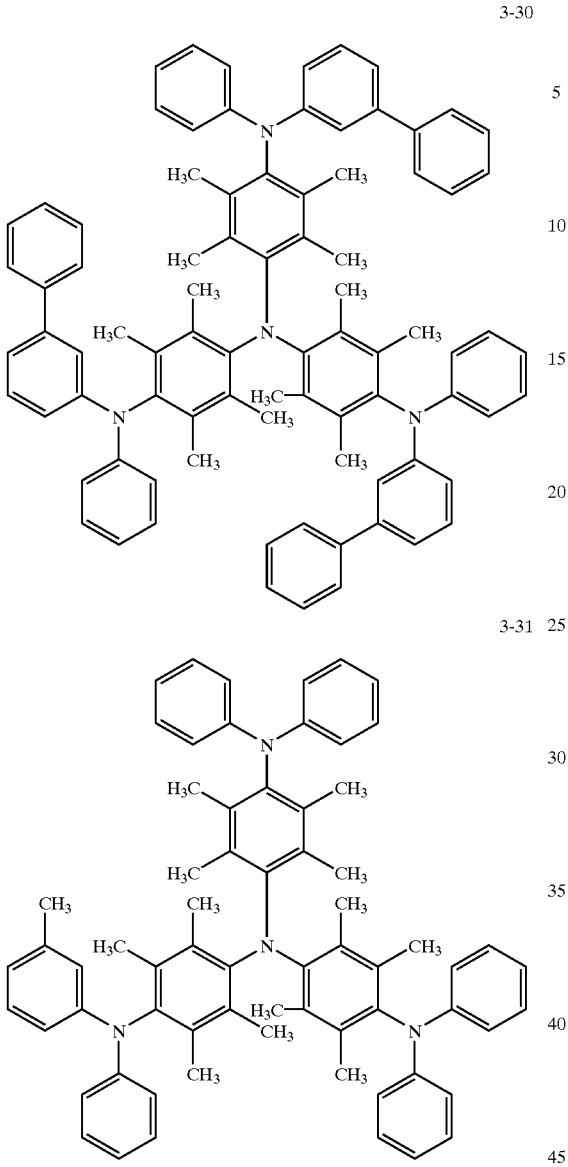
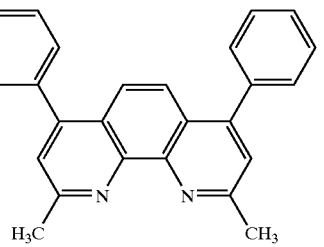
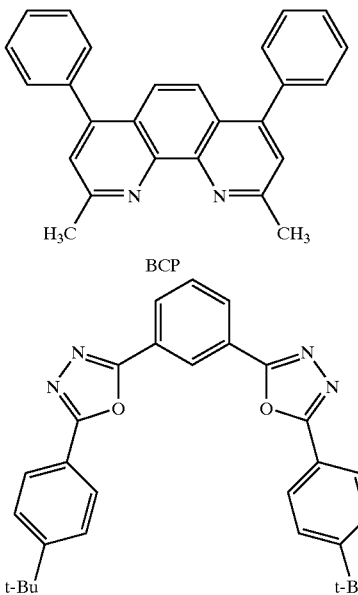
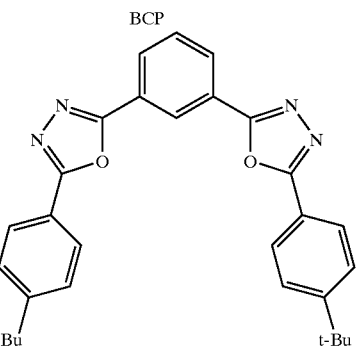
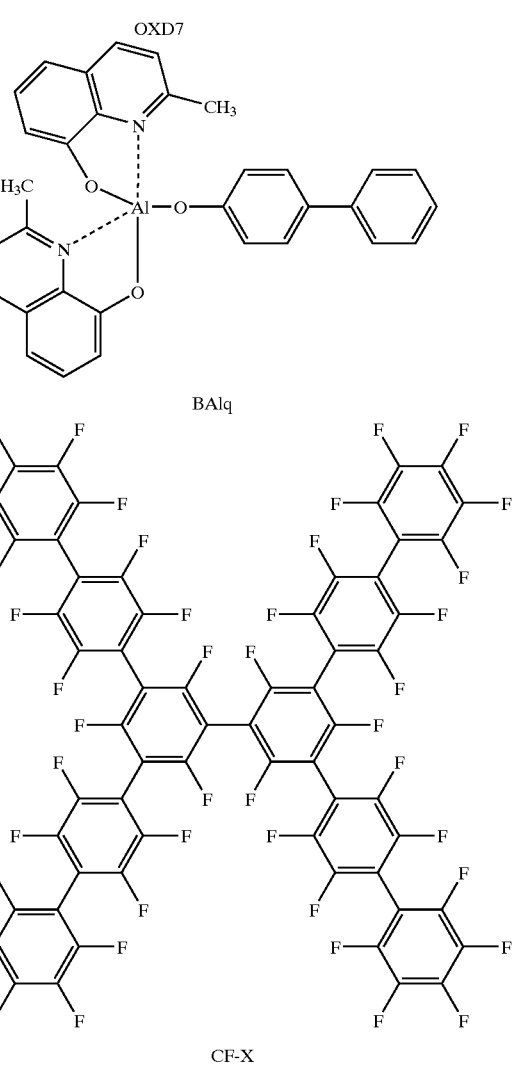

The hole transporting layer can be formed by layering the hole transporting material by a known method such as a vacuum deposition method, a spin coat method, a casting method, an ink jet method, and an LB method. The thickness of the hole transporting layer is not specifically limited, but is ordinarily from 5 to 5000 nm. The hole transporting layer may be composed of a single layer structure comprising one or two or more of the materials mentioned above.

The electron transporting layer comprises a material (an electron transporting material) having an electron transporting ability, and in a broad sense refers to an electron injecting layer or a hole blocking layer. The electron transporting layer can be provided as a single layer or plural layers.

As an electron transporting material (which serves also as a hole blocking material) used in a single electron transporting layer or in the electron transporting layer closest to the cathode of plural electron transporting layers, compounds listed below are known.

In the invention, at least one electron transporting layer is provided between a cathode and a light emission layer, and an electron transporting material (which serves also as a hole blocking material) used in the electron transporting layer is an electron transporting material (hereinafter referred to also as the electron transporting material in the invention) having a maximum fluorescence wavelength of not longer than 415 nm, a molecular weight of from 500 to 2000 and a ratio F/(H+F) of from 0 to 0.9, wherein the ratio F/(H+F) represents a ratio of the fluorine atom number to the sum of the fluorine atom number and the hydrogen atom number in the molecule of the material. It is preferred that in the plural electron transporting layers, an electron transporting layer, which is adjacent to the light emission layer on the cathode side, is comprised of the electron transporting material in the invention. Examples of the electron transporting material in the invention are listed below, but the present invention is not limited thereto.

1

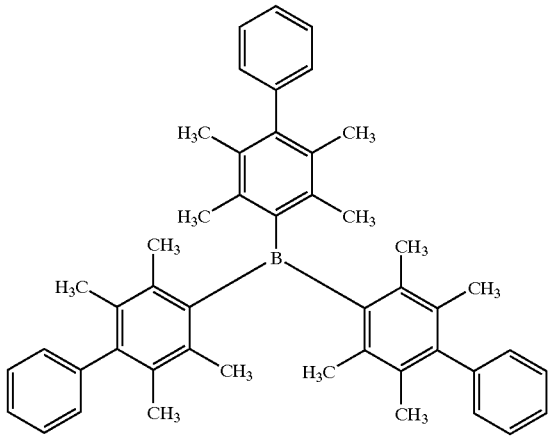

2

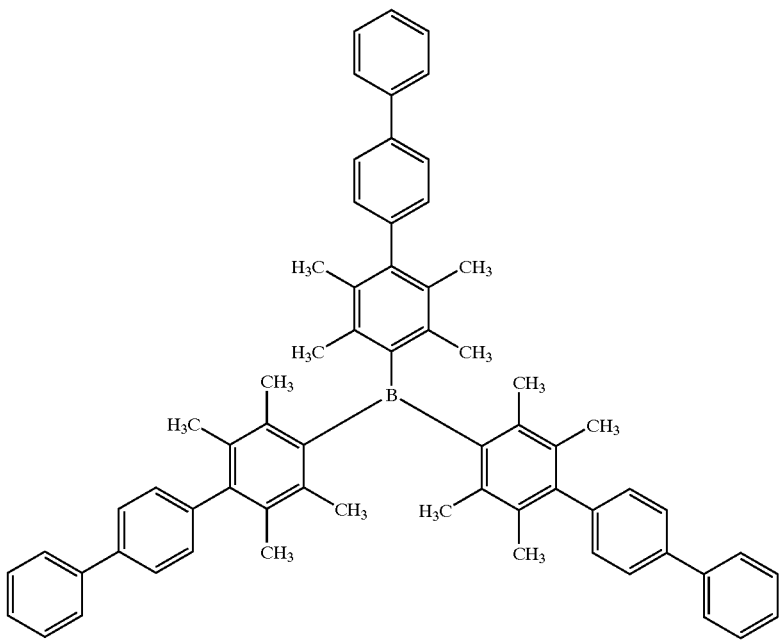

-continued
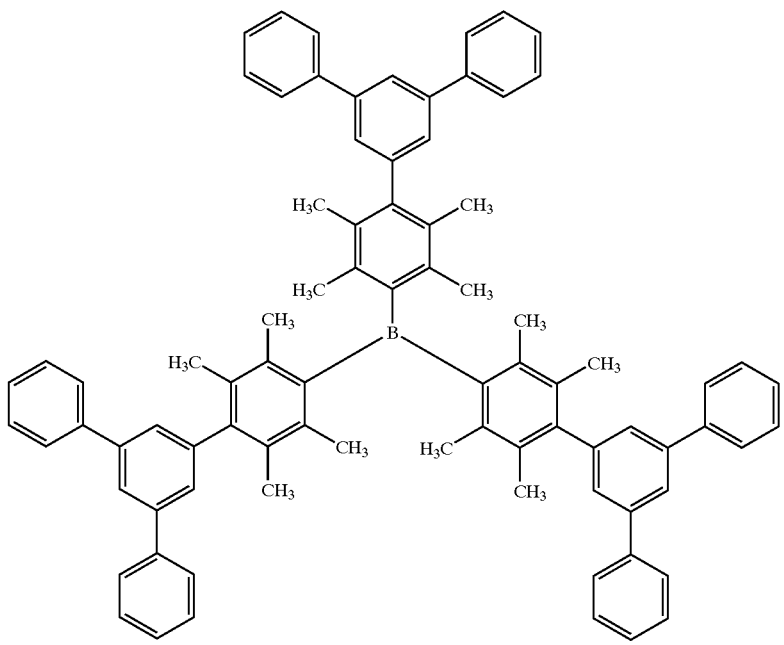
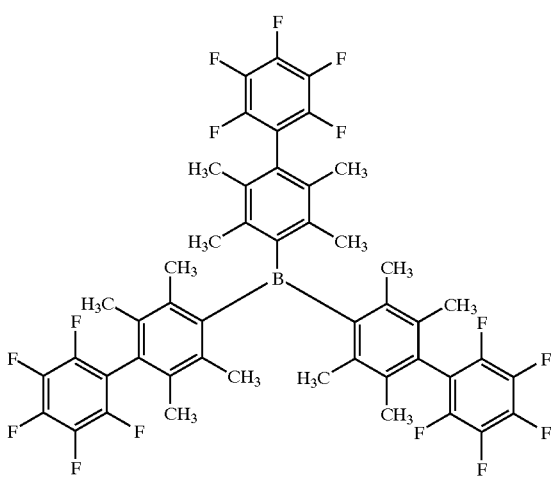

5
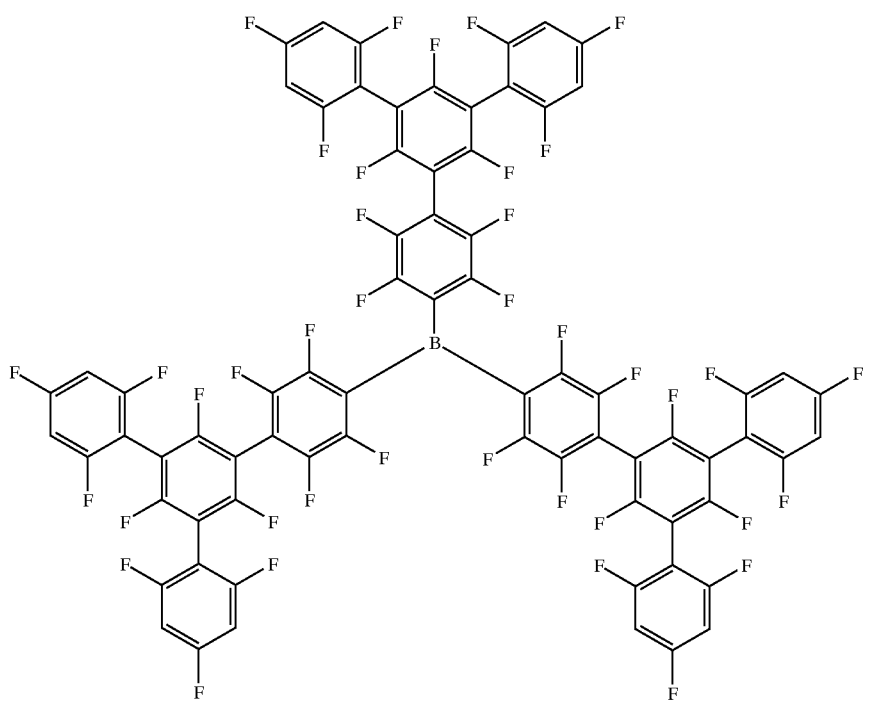
6
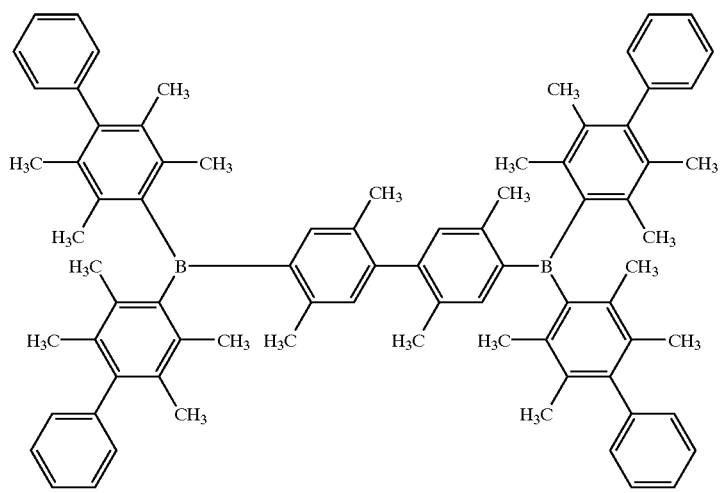
7 8
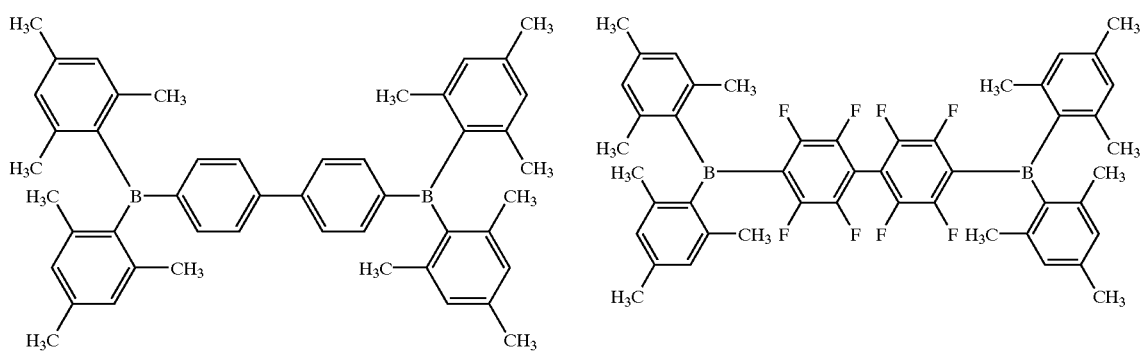

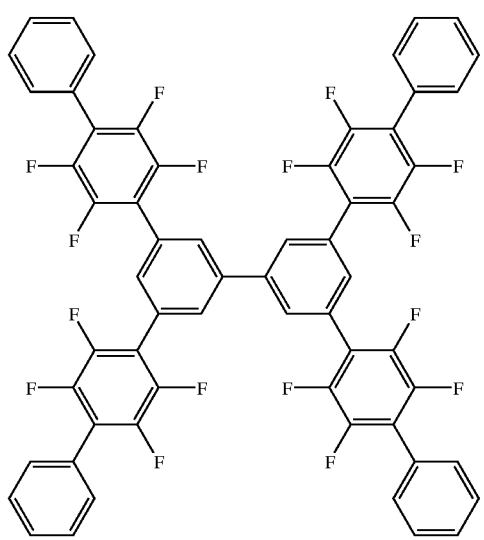
9
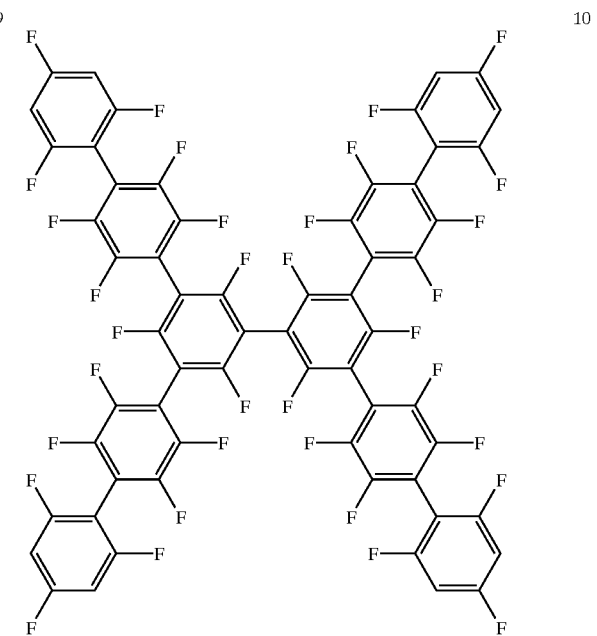
10
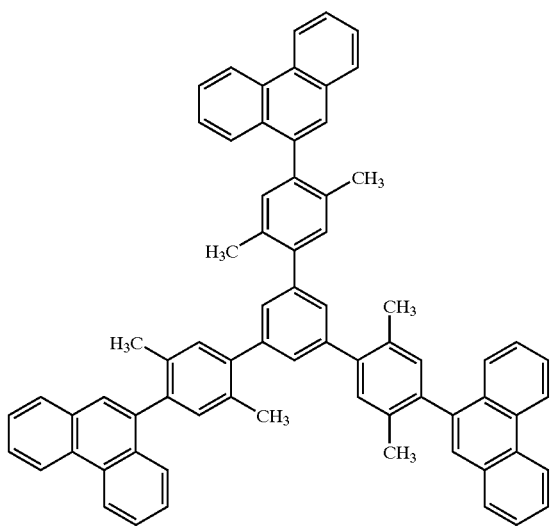
11
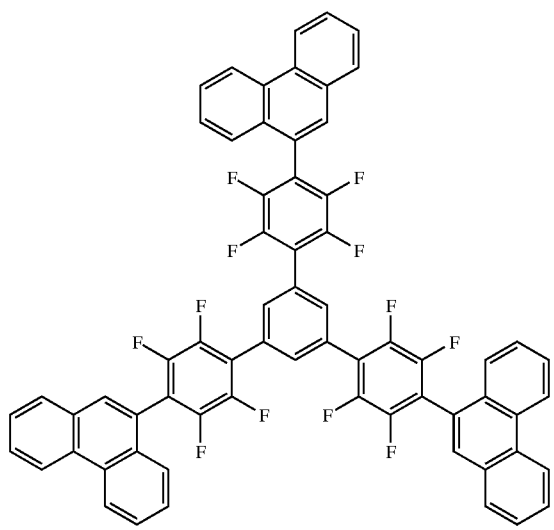
12

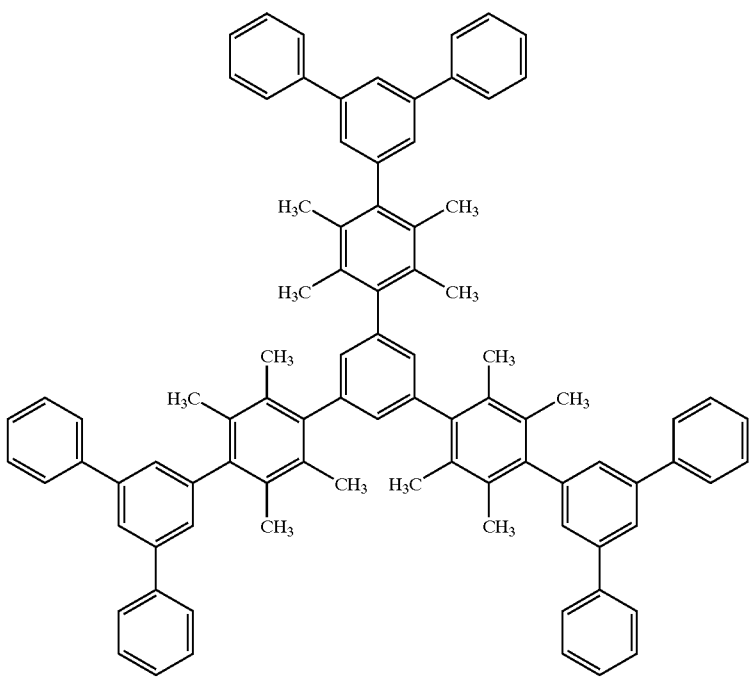
13
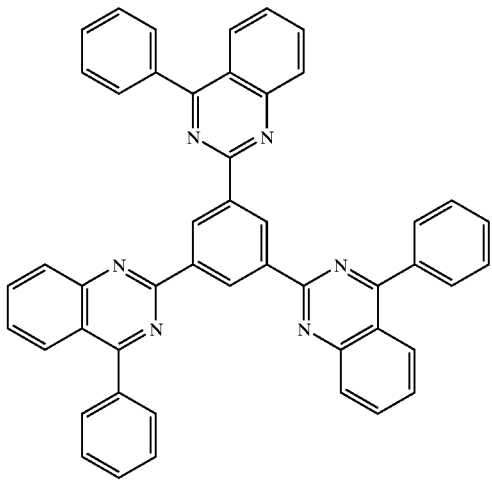
14
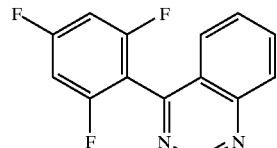
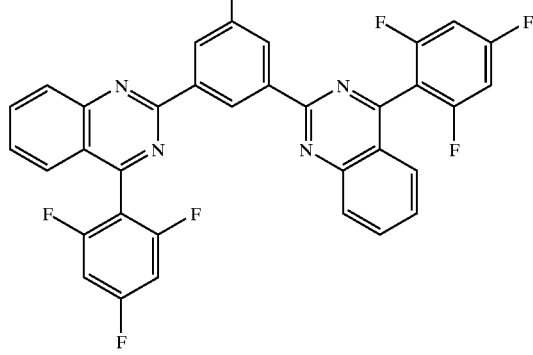
15
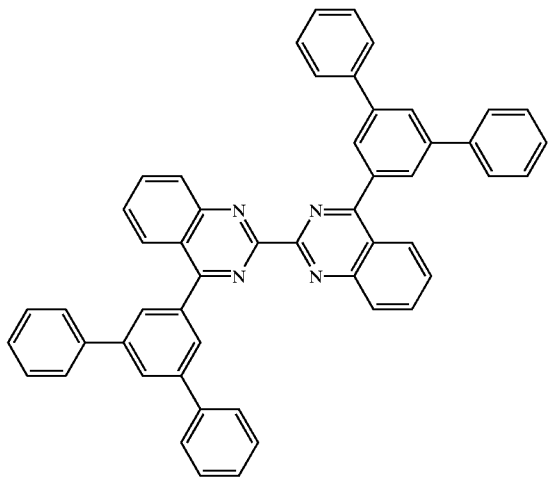
16

-continued

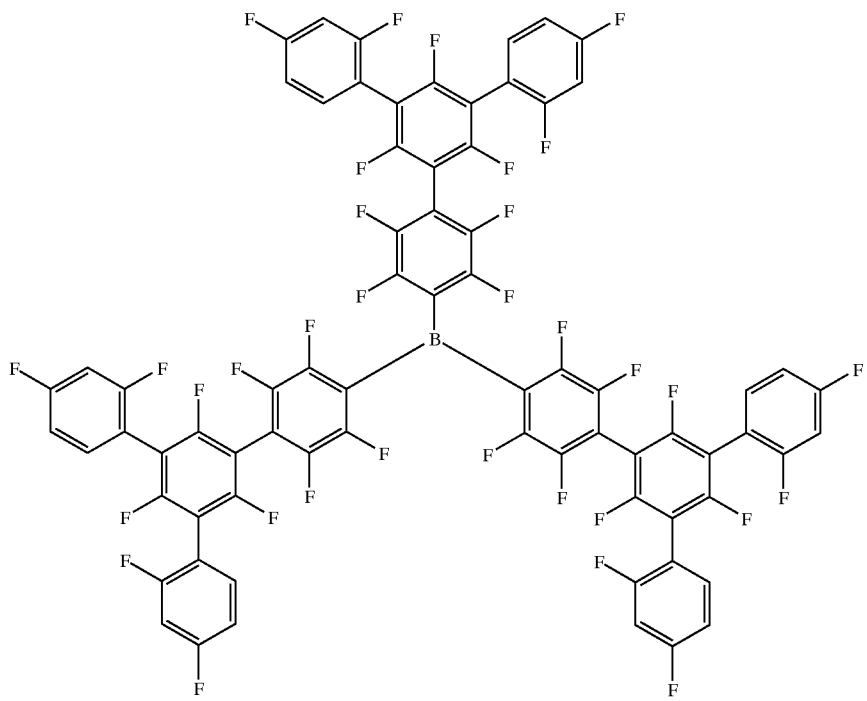

When plural electron transporting layers are used, at least one of the electron transporting layers is comprised of the electron transporting material in the invention, and the other electron transporting layers are formed employing one selected from the known electron transporting materials used in the electron transporting layer of the conventional organic El element without being specifically limited. Herein, that at least one layer of the electron transporting layers is comprised of the electron transporting material in the invention is that at least one layer of the electron transporting layers comprises the electron transporting material in the invention in an amount of not less than 50% by weight, and may contain other materials as the rest. In the invention, at least one layer of the electron transporting layers comprises the electron transporting material in the invention in an amount of preferably not less than 90% by weight.

Examples of the known electron transporting material include a phenanthroline derivative, a bipyridine derivative, a nitro-substituted fluorene derivative, a diphenylquinone derivative, a thiopyran dioxide derivative, a tetracarboxylic acid anhydride such as naphthalene tetracarboxylic acid anhydride or perylene tetracarboxylic acid anhydride, a carbodiimide, a fluolenylidenemethane derivative, an anthraquinodimethane, an anthrone derivative, and an oxadiazole derivative. Moreover, a thiadiazole derivative which is formed by substituting the oxygen atom in the oxadiazole ring of the foregoing oxadiazole derivative with a sulfur atom, and a quinoxaline derivative having a quinoxaline ring known as an electron withdrawing group are usable as the electron transporting material or electron injecting material.

A polymer in which the material mentioned above is introduced in the polymer chain or a polymer having the material as the polymer main chain can be also used.

A substrate preferably employed for the organic electroluminescence element in the invention is not restricted to specific kinds of materials such as glass and plastic, as far as it is transparent. Examples of the substrate preferably used include glass, quartz and light transmissible plastic film. Especially preferred one is a resin film capable of providing flexibility to the organic EL element.

Examples of the resin film include films of polyethylene terephthalate (PET), polyethylene naphthalate (PEN), polyethersulfone (PES), polyetherimide, polyetheretherketone, polyphenylene sulfide, polyarylate, polyimide, polycarbonate (PC), cellulose triacetate (TAC), cellulose acetate propionate (CAP) and so on.

The surface of the resin film may have a layer of an inorganic or organic compound or a hybrid layer of both compounds.

The external light emission efficiency of the organic electroluminescence element of the invention is preferably not less than 1%, and more preferably not less than 2% at room temperature. Herein, external quantum yield (%) is represented by the following formula:

External quantum yield (%)=(the number of photons emitted to the exterior of the organic electroluminescence element×100)/ (the number of electrons supplied to the organic electroluminescence element)

A hue improving filter such as a color filter may be used in combination. The multicolor light emission apparatus of the invention comprises at least two organic EL elements each having a different maximum emission wavelength. Next, preferable examples in the preparation of the organic EL element will be explained. For one example, the preparation of the organic EL element, which has the constitution, Anode/Hole injecting layer/Hole transporting layer/Light emission layer/Electron transporting layer/Electron injecting layer/Cathode, will be described. A thin layer of a desired material for an electrode such as a material of the anode is formed on a suitable substrate by a deposition or sputtering method to prepare the anode, so that the thickness of the layer is not more than 1 um, and preferably within the range of from 10 to 200 nm. Then the hole injecting layer, the hole transporting layer, the light emission layer, the electron transporting layer and the electron injecting layer, which constitute the element, are formed on the resulting anode in that order as organic compound thin layers.

As methods for formation of the thin layers, there are a spin coating method, a casting method, an ink jet method, a vacuum deposition method, and a printing method, however, a spin coating method and a vacuum deposition method are preferably used, since a uniform layer can be formed and a pinhole is formed with difficulty. Different methods may be used for formation of different layers. When the vacuum deposition method is used for the thin layer formation method, although conditions of the vacuum deposition differs due to kinds of materials used, vacuum deposition is preferably carried out at a boat temperature of from 50° C. to 450° C., at a degree of vacuum of from $10^{-6}$ to $10^{-2}$ Pa, at a deposition speed of from 0.01 to 50 nm/second, and at a substrate temperature of from −50 to 300° C. to form a layer with a thickness of from 0.1 nm to 5 $\mu$m.

After these layers has been formed, a thin layer comprised of a material for a cathode is formed thereon to prepare a cathode, employing, for example, a deposition method or sputtering method to give a thickness of not more than 1 $\mu$m, and preferably from 50 to 200 nm. Thus, a desired organic EL element is obtained. It is preferred that the layers from the hole injecting layer to the cathode are continuously formed under one time of vacuuming to obtain an organic EL element. However, on the way of the layer formation under vacuum a different layer formation method may be inserted. When the different method is used, its process is required to be carried out under a dry inert gas atmosphere.

In the multicolor display of the invention, the light emission layer only is formed using a shadow mask, and other layers than the light emission layer are common, and can be formed employing a vacuum method, a casting method, a spin coat method or a printing method in which patterning employing the shadow mask is not required.

When the light emission layer only is formed by patterning, the layer formation method, although not specifically limited, is carried out preferably according to a deposition method, an ink jet method or a printing method. When a deposition method is used as the layer formation method, patterning of the layer is preferably carried out employing a shadow mask.

Further, the organic EL element can be prepared in the reverse order, in which the cathode, the electron injecting layer, the electron transporting layer, the light emission layer, the hole transporting layer, the hole injecting layer, and the anode are formed in that order.

When a direct current voltage, a voltage of 2 to 40 V is applied to the thus obtained multicolor display, setting the anode as a + polarity and the cathode as a − polarity, light emission occurs. When voltage is applied with the reverse polarity, no current flows, and light is not emitted at all. When an alternating voltage is applied, light emission occurs only at the time when the polarity of the anode is "+" and that of the cathode is "−". The wave shape of the alternating current may be any one.

The multicolor display of the invention can be used as a display device, a display, or various light emission sources. The display device or the display, which employs three kinds of organic EL elements, an element emitting a blue light, an element emitting a red light and an element emitting a green light, can present a full color image.

Examples of the display device or the display include a television, a personal computer, a mobile device or an AV device, a display for text broadcasting, and an information display used in a car. The multicolor emission apparatus may be used as particularly a display for reproducing a still image or a moving image. When the apparatus is used as a display for reproducing a moving image, the driving method may be either a simple matrix (passive matrix) method or an active matrix method.

Examples of the light emission sources include a home lamp, a room lamp in a car, a backlight for a watch or a liquid crystal, a light source for boarding advertisement, a signal device, a light source for a photo memory medium, a light source for an electrophotographic copier, a light source for an optical communication instrument, and a light source for an optical sensor, but are not limited thereto.

The organic EL element of the invention may be an organic EL element having a resonator structure.

The organic EL element having a resonator structure is applied to a light source for a photo-memory medium, a light source for an electrophotographic copier, a light source for an optical communication instrument, or a light source for a photo-sensor, but its application is not limited thereto.

In the above application, a laser oscillation may be carried out.

EXAMPLES

The present invention will be explained in the following examples, but is not limited thereto.

Example 1

[Preparation of Organic EL Element Sample]

A pattern was formed on a substrate (manufactured by NH Technoglass Co., Ltd.) composed of a glass plate (100 mm×100 mm×1.1 mm) and a 150 nm ITO (indium tin oxide) layer as an anode. Then the resulting transparent substrate having the ITO transparent electrode was subjected to ultrasonic washing in i-propyl alcohol and dried by a dry nitrogen gas and subjected to UV-ozone cleaning for 5 minutes.

The thus obtained transparent substrate was fixed on a substrate holder of a vacuum deposition apparatus available on the market. Further, 200 mg of α-NPD were put in a first resistive heating molybdenum boat, 200 mg of CBP were put in a second resistive heating molybdenum boat, 200 mg of bathocuproine (BCP) were put in a third resistive heating molybdenum boat, 100 mg of Ir-10 (phosphorescent compound) were put in a fourth resistive heating molybdenum boat, and 200 mg of tris(8-quinolinolato)aluminum (III), (Alq$_3$) were put in a fifth resistive heating molybdenum boat. The resulting boats were set in the vacuum deposition apparatus, and pressure in the vacuum tank was reduced to $4 \times 10^{-4}$ Pa. Then, the boat carrying α-NPD being heated to 220° C. by supplying an electric current to the boat, α-NPD was deposited onto the transparent substrate at a depositing speed of 0.1 nm/sec to form a hole transporting layer with a thickness of 45 nm. After that, the boat carrying CBP and the boat carrying Ir-10 being heated to 220° C. by supplying an electric current to both boats, CBP at a depositing speed of 0.1 nm/sec and Ir-10 at a depositing speed of 0.01 nm/sec were co-deposited onto the resulting hole transporting layer to form a light emission layer with a thickness of 20 nm. The temperature of the substrate at the time of the deposition was room temperature. Subsequently, the boat carrying BCP being heated to 250° C. by supplying an electric current to the boat, BCP was deposited onto the resulting light emission layer at a depositing speed of 0.1 nm/sec to form a first electron transporting layer with a thickness of 10 nm which could function as a hole blocking layer. Further, the boat carrying Alq$_3$ being heated to 250° C. by supplying an electric current to the boat, Alq₃ was deposited onto the resulting electron transporting layer at a depositing speed of 0.1 nm/sec to form a second electron transporting layer with a thickness of 40 nm. The temperature of the substrate at the time of the deposition was room temperature.

Next, the vacuum tank was opened, and a stainless steel mask having a rectangular hole was placed on the second electron transporting layer. Further, 3 g of magnesium were put in a resistive heating molybdenum boat and 0.5 g of silver were put in a tungsten basket for deposition. The resulting boat and basket were set in the vacuum tank. Pressure in the vacuum tank was reduced to $2 \times 10^{-4}$ Pa. Then, the boat carrying magnesium was heated by supplying an electric current so as to deposit magnesium at a deposition speed of from 1.5 to 2.0 nm/sec, and at this time, the basket carrying silver was simultaneously heated so as to deposit silver at a deposition speed of 0.1 nm/sec to form a cathode electrode composed of a mixture of magnesium and silver. Thus, a comparative organic EL element sample No. 1 was prepared.

Organic EL element sample Nos. 2 through 19 were prepared in the same manner as comparative organic EL element sample No. 1, except that BCP used in the hole blocking layer, CBP as a host compound used in the light emission layer, or α-NPD used in the hole transporting layer was replaced with those as shown in Table 1.

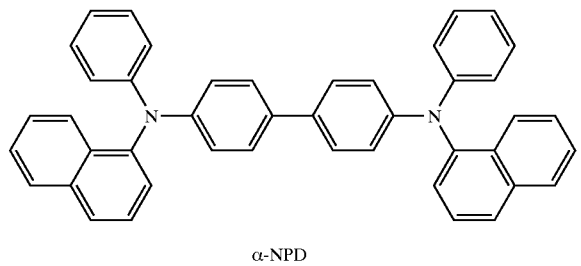

α-NPD

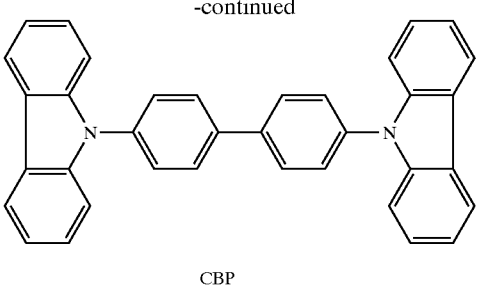

CBP

[Evaluation]
(Emission Luminance)

When an initial driving voltage of 3V was applied to comparative organic EL element sample No. 1, an electric current began flowing and a blue light was emitted from the phosphorescent compound as the dopant compound in the light emission layer. When a direct current voltage of 9V was applied to comparative organic EL element sample No. 1 at 23° C. in an atmosphere of a dry nitrogen gas, emission luminance of light emitted from the sample No. 1 was measured according to CS-1000 produced Minolta Co., Ltd. Emission luminance of light emitted from each of the organic EL element sample Nos. 2 through 19 was measured in the same way as above, and expressed by a relative value when the resulting emission luminance of light emitted from the organic EL element sample No. 1 was set at 100. The results are shown in Table 1.

(Emission Lifetime)

When an initial emission luminance of comparative organic EL element sample No. 1 was 100 cd/m², being measured at 23° C. in an atmosphere of a dry nitrogen gas, time when the initial emission luminance was reduced by half was set at 100. The time of each of the organic EL element sample Nos. 2 through 19 was measured in the same way as above, and expressed by a relative value when the time of comparative organic EL element sample No. 1 was set at 100. The resulting value was a measure of emission lifetime. The results are shown in Table 1.

TABLE 1

| Sample No. | First electron transporting layer (serves also as hole blocking layer) | | | | Light emission layer | | Hole transporting layer | | Evaluation | | Remarks |
|---|---|---|---|---|---|---|---|---|---|---|---|
| | Compounds | λmax (nm) | Molecular weight | F/(H + F) | Compounds | λmax (nm) | Compounds | λmax (nm) | Emission luminance (relative value) | Emission lifetime (relative value) | |
| 1 | BCP | 398 | 360 | 0 | CBP | 405 | α-NPD | 440 | 100 | 100 | Comp. |
| 2 | OXD7 | 375 | 478 | 0 | CBP | 405 | α-NPD | 440 | 114 | 109 | Comp. |
| 3 | BAlq | 492 | 512 | 0 | CBP | 405 | α-NPD | 440 | 60 | 835 | Comp. |
| 4 | CF-X | | 1518 | 1 | TCTA | 390 | α-NPD | 440 | 125 | 111 | Comp. |
| 5 | 1 | 401 | 639 | 0 | CBP | 405 | α-NPD | 440 | 123 | 745 | Inv. |
| 6 | 3 | 401 | 1095 | 0 | CBP | 405 | α-NPD | 440 | 121 | 856 | Inv. |
| 7 | 4 | 398 | 909 | 0.29 | CBP | 405 | α-NPD | 440 | 130 | 1024 | Inv. |
| 8 | 4 | 398 | 909 | 0.29 | TCTA | 390 | α-NPD | 440 | 150 | 1147 | Inv. |
| 9 | 4 | 398 | 909 | 0.29 | 2-12 | 395 | α-NPD | 440 | 148 | 1130 | Inv. |
| 10 | 4 | 398 | 909 | 0.29 | CBP | 405 | 3-21 | 393 | 172 | 1130 | Inv. |
| 11 | 4 | 398 | 909 | 0.29 | CBP | 405 | 3-1 | 385 | 165 | 1112 | Inv. |
| 12 | 5 | 395 | 1629 | 0.76 | CBP | 405 | α-NPD | 440 | 130 | 895 | Inv. |
| 13 | 11 | 395 | 919 | 0 | CBP | 405 | α-NPD | 440 | 114 | 865 | Inv. |
| 14 | 11 | 395 | 919 | 0 | TCTA | 390 | α-NPD | 440 | 131 | 997 | Inv. |
| 15 | 11 | 395 | 919 | 0 | 2-12 | 395 | α-NPD | 440 | 129 | 989 | Inv. |
| 16 | 11 | 395 | 919 | 0 | CBP | 405 | 3-21 | 393 | 152 | 1034 | Inv. |
| 17 | 11 | 395 | 919 | 0 | CBP | 405 | 3-1 | 385 | 149 | 1007 | Inv. |
| 18 | 14 | 415 | 691 | 0 | CBP | 405 | α-NPD | 440 | 111 | 798 | Inv. |
| 19 | 17 | 403 | 1521 | 0.64 | CBP | 405 | α-NPD | 440 | 120 | 1104 | Inv. |

"λmax" represents a maximum fluorescence wavelength.
Comp.: Comparative, Inv.: Inventive As is apparent from Table 1, inventive organic EL element samples comprising a material having a molecular weight falling within the claimed range provide longer lifetime as compared with comparative organic EL element sample Nos. 1 and 2. Inventive organic EL element samples comprising a material having a maximum fluorescence wavelength falling within the claimed range provide higher emission luminance as compared with comparative organic EL element sample No. 3. Further, inventive organic EL element samples, comprising a material having a ratio F/(H+F) falling within the claimed range, provide greatly improved lifetime as compared with that of comparative organic EL element sample No. 4. Particularly when the hole transporting material having a maximum fluorescence wavelength of not more than 415 nm is used, the organic EL element samples exhibit further higher emission luminance.

Organic EL elements prepared in the same manner as in organic EL element samples No. 1 through 16, except that Ir-1 was used instead of Ir-10, exhibited the same results as above. Organic EL elements prepared in the same manner as in organic EL element samples No. 1 through 16, except that Ir-9 was used instead of Ir-10, exhibited the same results as above. Green light was emitted from organic EL elements employing Ir-1, and red light was emitted from organic EL elements employing Ir-9.

Example 2
[Preparation of Multicolor Display]
(Preparation of Blue Light Emission Element)

An ITO layer with a thickness of 200 nm was deposited on a glass substrate to form an anode (a sheet resistance of 30 Ω/□). Material 3-21 was vacuum deposited on the anode through a shadow mask to obtain a hole transporting layer with a thickness of 60 nm. Subsequently, TCTA and Ir-10 (phosphorescent compound) (TCTA:Ir-10=97:3) were co-deposited on the hole transporting layer to obtain a blue light emission layer with a thickness of 40 nm.

Further, compound 4 was deposited on the resulting layer to form a first electron transporting layer with a thickness of 30 nm which served also as a hole blocking layer, and $Alq_3$ was vacuum deposited on the resulting electron transporting layer to form a second electron transporting layer with a thickness of 20 nm. Thus, a blue light emission element was obtained.

(Preparation of Green Light Emission Element)

After that, the shadow mask was laterally shifted, and a-NPD was vacuum deposited on the anode through the shadow mask to obtain a hole transporting layer with a thickness of 30 nm. Subsequently, TCTA and Ir-1 (phosphorescent compound) (TCTA:Ir-1=97:3) were co-deposited on the hole transporting layer to obtain a green light emission layer with a thickness of 20 nm.

Further, material 4 was deposited on the resulting layer to form a third electron transporting layer with a thickness of 30 nm which served also as a hole blocking layer, and $Alq_3$ was vacuum deposited on the resulting electron transporting layer to form a fourth electron transporting layer with a thickness of 20 nm. Thus, a green light emission element was obtained.

(Preparation of Red Light Emission Element)

After that, the shadow mask was further laterally shifted, and a-NPD was vacuum deposited on the anode through the shadow mask to obtain a hole transporting layer with a thickness of 40 nm. Subsequently, Bebq and DCM II (Bebq:DCM-II=97:3) were co-deposited on the hole transporting layer to obtain a red light emission layer with a thickness of 30 nm.

Further, material 4 was deposited on the resulting layer to form a fifth electron transporting layer with a thickness of 30 nm which served also as a hole blocking layer, and $Alq_3$ was vacuum deposited on the resulting electron transporting layer to form a sixth electron transporting layer with a thickness of 30 nm. Thus, a red light emission element was obtained.

Next, the shadow mask was removed, LiF was deposited on the entire surface of the resulting electron transporting layer to form an LiF layer with a thickness of 0.5 nm. Finally, a shadow mask was placed on the LiF layer, and Al was deposited through the shadow mask to form a cathode with a thickness of 200 nm. Thus, a multicolor display device was obtained which comprised the blue, green and red light emission elements each provided on the same substrate.

The maximum fluorescence wavelength of material 4 was 398 nm, being measured as a layer. The maximum emission wavelength of the blue light emission element was 460 nm, the maximum emission wavelength of the green light emission element was 520 nm, and the maximum emission wavelength of the red light emission element was 645 nm.

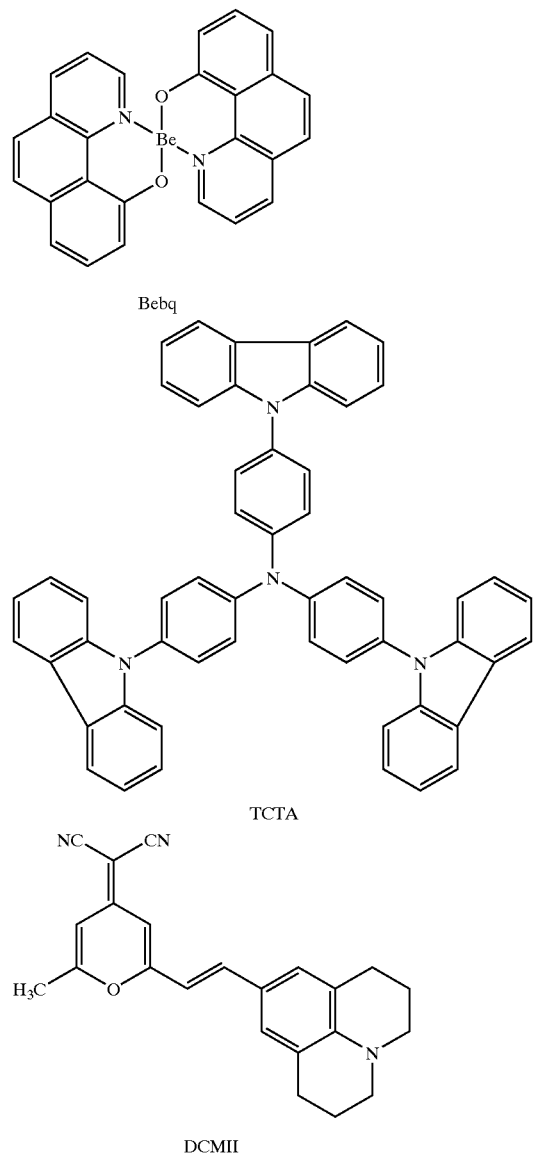

Bebq

TCTA

DCMII

FIG. 1 shows a schematic drawing of a displaying section 101 of a full color display prepared employing the multicolor display device obtained above. The displaying section 101 comprises a base plate 1, and provided thereon, plural pixels 3 (including blue light emission pixels, green light emission pixels, and red light emission pixels) and a wiring section 2 including plural scanning lines 5 and plural data lines 6. The plural scanning lines 5 and plural data lines 6 each are composed of electroconductive material. The plural scanning lines 5 and plural data lines 6 were crossed with each other at a right angle, and connected with the pixels 3 at the crossed points (not illustrated in detail). Each of the plural pixels 3, which comprise an organic EL element corresponding to the respective color, a switching transistor as an active element, and a driving transistor, is driven according to an active matrix system. The plural pixels 3, when scanning signal is applied from the scanning lines 5, receives the image data signal from the data lines 6, and emits light corresponding to the image data received. A multicolor image can be displayed by a red light emission pixel, a green light emission pixel, and a blue light emission pixel, each suitably arranged on the base plate.

A full color clear moving image with high luminance was obtained by driving the full color display prepared above.

Example 3

Figure 2:
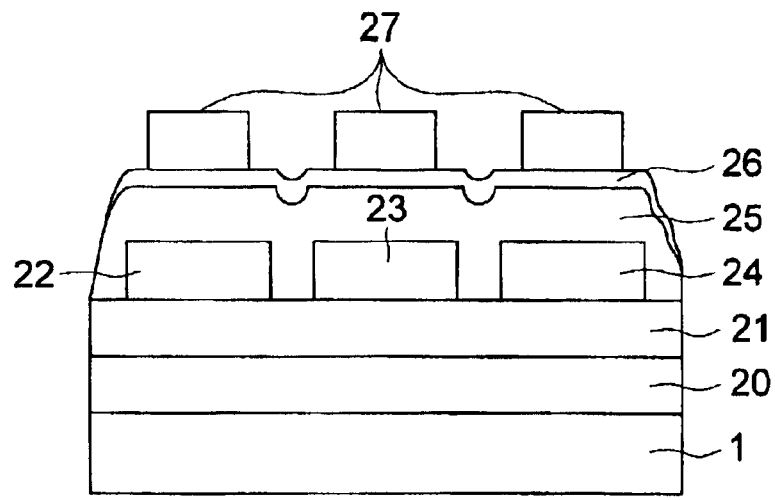
FIG. 2 is a schematic drawing of a multicolor display.

A multicolor display having a layer structure as shown in FIG. 2 was prepared according to the following procedures.

An ITO layer with a thickness of 200 nm was deposited on a glass substrate 1 to form an anode 20 (a sheet resistance of 30 $\Omega/\square$). Material 3-21 was vacuum deposited on the entire surface of the anode employing a vacuum deposition method to obtain a hole transporting layer 21 with a thickness of 60 nm. Subsequently, a shadow mask was placed on the resulting hole transporting layer, and TCTA and Ir-10 (phosphorescent compound) (TCTA:Ir-10=97:3) were co-deposited on the hole transporting layer through the shadow mask to obtain a blue light emission layer 22 with a thickness of 33 nm.

After that, the shadow mask was laterally shifted, and TCTA and Ir-1 (phosphorescent compound) (TCTA:Ir-1=97:3) were co-deposited on the hole transporting layer to obtain a green light emission layer 23 with a thickness of 33 nm.

After that, the shadow mask was further laterally shifted, and TCTA and Ir-9 (phosphorescent compound) (TCTA:Ir-9=97:3) were co-deposited on the hole transporting layer to obtain a red light emission layer 24 with a thickness of 33 nm.

Next, the shadow mask was removed, material 4 was deposited on the entire surface of the resulting layer to obtain an electron transporting layer 25 with a thickness of 30 nm, which served also as a hole blocking layer. Further, Alq$_3$ was vacuum deposited on the resulting electron transporting layer 25 to form an electron transporting layer 26 with a thickness of 20 nm.

Finally, a shadow mask was placed on the electron transporting layer 26, and Al was deposited on the layer through the shadow mask to form a cathode 27 with a thickness of 200 nm. Thus, a multicolor display having the layer constitution as shown in FIG. 2 was obtained.

In the emission properties of the multicolor display prepared above, the maximum emission wavelength of the blue light emission element was 440 nm, the maximum emission wavelength of the green light emission element was 510 nm, and the maximum emission wavelength of the red light emission element was 580 nm.

The multicolor display obtained above could provide a full color clear moving image with high luminance.

The above method of preparing the multicolor display employs materials common except for the dopant compound used in each of the light emission layers. That is, deposition of each of material 3-21, material 4 and Alq$_3$, which are materials common to each of the light emission layers, is carried out at one time. Accordingly, this multicolor display preparing method reduces the preparing steps as compared with that of Example 2.

[Efeect of the Invention]

The present invention can provide an organic electroluminescence element improved both in emission lifetime and emission luminance, and a display employing the organic electroluminescence element, which emits light with high emission luminance at reduced power.

What is claimed is:

1. An organic electroluminescence element comprising a cathode, a light emission layer containing a host compound and a dopant compound, and at least one first layer provided between the cathode and the light emission layer, wherein the dopant compound is a phosphorescent compound, and the first layer is comprised of a first material having a molecular weight of from 500 to 2000, a maximum fluorescence wavelength of not longer than 415 nm, and an F to (H+F) ratio F/(H+F) of from 0 to 0.9 in which F and H represent the fluorine atom number and the hydrogen atom number in the molecule of the material, respectively.

2. The organic electroluminescence element of claim 1, wherein the molecular weight of the first material is from 500 to 2000.

3. The organic electroluminescence element of claim 1, wherein the F to (H+F) ratio F/(H+F) of the first material is from 0.1 to 0.7.

4. The organic electroluminescence element of claim 1, wherein the maximum fluorescence wavelength of the first material is not longer than 400 nm.

5. The organic electroluminescence element of claim 1, wherein one of the first layers is adjacent to the light emission layer.

6. The organic electroluminescence element claim 1, wherein the host compound has a maximum fluorescence wavelength of not longer than 415 nm.

7. The organic electroluminescence element of claim 6, wherein the host compound has a maximum fluorescence wavelength of not longer than 400 nm.

8. The organic electroluminescence element of claim 1, further comprising an anode on the side of the light emission layer opposite the cathode and at least one second layer provided between the anode and the light emission layer, wherein the second layer is comprised of a second material.

9. The organic electroluminescence element of claim 8, wherein the second material has a maximum fluorescence wavelength of not longer than 415 nm.

10. A display having an organic electroluminescence element comprising a cathode, a light emission layer containing a host compound and a dopant compound, and at least one first layer provided between the cathode and the light emission layer, wherein the dopant compound is a phosphorescent compound, and the first layer is comprised of a first material having a molecular weight of from 500 to 2000, a maximum fluorescence wavelength of not longer than 415 nm, and an F to (H+F) ratio F/(H+F) of from 0 to 0.9 in which F and H represent the fluorine atom number and the hydrogen atom number in the molecule of the material, respectively.

11. A multicolor display comprising two or more kinds of organic electroluminescence elements, which emit lights with different maximum emission wavelengths according to electroluminescence, wherein at least one organic electroluminescence element of the elements is an organic electroluminescence element comprising a cathode, a light emission layer containing a host compound and a dopant compound, and at least one first layer provided between the cathode and the light emission layer, wherein the dopant compound is a phosphorescent compound, and the first layer is comprised of a first material having a molecular weight of from 500 to 2000, a maximum fluorescence wavelength of not longer than 415 nm, and an F to (H+F) ratio F/(H+F) of from 0 to 0.9 in which F and H represent the fluorine atom number and the hydrogen atom number in the molecule of the material, respectively.

12. The organic electroluminescence element of claim 1, wherein the first layer is an electron transporting layer, and the first material is an electron transporting material having a molecular weight of from 500 to 2000, a maximum fluorescence wavelength of not longer than 415 nm, and an F to (H+F) ratio F/(H+F) of from 0 to 0.9 in which F and H represent the fluorine atom number and the hydrogen atom number in the molecule of the material, respectively.

13. The organic electroluminescence element of claim 8, wherein the second layer is a hole transporting layer, and the second material is a hole transporting material with a maximum fluorescence wavelength of not longer than 415 nm.

* * * * *